(12) United States Patent
Neudorfer

(10) Patent No.: US 8,164,901 B2
(45) Date of Patent: Apr. 24, 2012

(54) HIGH EFFICIENCY HEAT REMOVAL SYSTEM FOR RACK MOUNTED COMPUTER EQUIPMENT

(76) Inventor: Julius Neudorfer, Dobbs Ferry, NY (US)

( * ) Notice: Subject to any disclaimer, the term of this patent is extended or adjusted under 35 U.S.C. 154(b) by 0 days.

(21) Appl. No.: 12/322,967

(22) Filed: Feb. 10, 2009

(65) Prior Publication Data

US 2009/0262495 A1    Oct. 22, 2009

Related U.S. Application Data

(60) Provisional application No. 61/124,351, filed on Apr. 16, 2008.

(51) Int. Cl.
*H05K 7/20* (2006.01)

(52) U.S. Cl. .............. 361/699; 361/679.46; 361/679.47; 361/679.53; 361/688; 361/689; 165/80.2; 165/80.5; 165/104.21; 165/104.33; 165/185; 62/259.2

(58) Field of Classification Search ............. 361/679.46, 361/679.47, 679.52, 679.53, 679.54, 699–702, 361/715–717, 721–727, 732, 736; 165/80.2, 165/80.4, 80.5, 104.33, 104.34, 104.21, 104.26, 165/185; 62/3.2, 3.3, 3.7, 113, 332, 259.2; 257/713–718; 174/15.1, 16.3, 252; 312/223.2, 312/223.3, 236; 454/184
See application file for complete search history.

(56) References Cited

U.S. PATENT DOCUMENTS

| | | | | |
|---|---|---|---|---|
| 6,310,772 B1 * | 10/2001 | Hutchison et al. | ............ | 361/700 |
| 6,643,132 B2 * | 11/2003 | Faneuf et al. | ................ | 361/700 |
| 6,693,797 B2 * | 2/2004 | Faneuf et al. | ................ | 361/689 |
| 6,700,785 B2 * | 3/2004 | Berry et al. | .................. | 361/726 |
| 6,714,412 B1 * | 3/2004 | Chu et al. | ................ | 361/699 |
| 6,775,137 B2 * | 8/2004 | Chu et al. | ................ | 361/696 |
| 6,776,221 B2 * | 8/2004 | Montgomery et al. | ......... | 165/46 |
| 6,796,372 B2 * | 9/2004 | Bear | ........................ | 165/104.21 |
| 6,807,056 B2 * | 10/2004 | Kondo et al. | ................ | 361/689 |
| 6,828,675 B2 * | 12/2004 | Memory et al. | ............. | 257/714 |
| 6,836,407 B2 * | 12/2004 | Faneuf et al. | ............ | 361/679.49 |
| 6,927,980 B2 * | 8/2005 | Fukuda et al. | ................ | 361/700 |
| 7,012,807 B2 * | 3/2006 | Chu et al. | ...................... | 361/699 |
| 7,024,573 B2 * | 4/2006 | Patel et al. | .................... | 713/324 |
| 7,050,299 B2 * | 5/2006 | Kondo et al. | ................ | 361/689 |

(Continued)

*Primary Examiner* — Michail V Datskovskiy
(74) *Attorney, Agent, or Firm* — Allan Chan; Allan Chan & Associates

(57) ABSTRACT

An efficient method of heat removal from rack mounted computer equipment, network gear and other electronic equipment, consisting of solid heat conducting components in direct contact with the heat generating sources. In particular, this invention is primarily focused on the ability to efficiently and effectively cool computer equipment in standard computer rack cabinets.

This invention utilizes a design that retains the general existing form factor of the rack mounted computer equipment, but uses direct contact heat transfer to a metal heat transfer conduit (Copper, Aluminum or other metal or efficient heat conducting material) contained within the computer equipment chassis. Furthermore, it is thermally coupled to an external rack mounted solid-to-fluid heat exchanger as an efficient method of heat transfer and removal. This is much more efficient than air as heat transfer medium which it the common method of heat removal from existing standardized rack mounted computer equipment.

This invention covers the design of the heat transfer components within the chassis of rack mounted computer server and the heat transfer system components external to the server within rack enclosure, as well as the external cooling system components necessary to connect to existing fluid based heat transfer and removal systems and processes.

2 Claims, 22 Drawing Sheets

U.S. PATENT DOCUMENTS

| | | |
|---|---|---|
| 7,057,893 B2 * | 6/2006 | Nicolai et al. ............... 361/699 |
| 7,133,283 B2 * | 11/2006 | Faneuf et al. ................ 361/689 |
| 7,187,549 B2 * | 3/2007 | Teneketges et al. .......... 361/699 |
| 7,233,491 B2 * | 6/2007 | Faneuf et al. ................ 361/689 |
| 7,318,322 B2 * | 1/2008 | Ota et al. .................... 62/259.2 |
| 7,349,213 B2 * | 3/2008 | Campbell et al. ............ 361/699 |
| 7,403,384 B2 * | 7/2008 | Pflueger ....................... 361/688 |
| 7,457,112 B2 * | 11/2008 | Fukuda et al. ........... 361/679.48 |
| 7,466,549 B2 * | 12/2008 | Dorrich et al. ............... 361/699 |
| 7,551,438 B2 * | 6/2009 | Seki ............................. 361/699 |
| 7,559,209 B2 * | 7/2009 | Nicolai et al. .............. 62/259.2 |
| 2007/0291452 A1 * | 12/2007 | Gilliland et al. ............. 361/699 |
| 2008/0225478 A1 * | 9/2008 | Goettert et al. .............. 361/687 |
| 2008/0266726 A1 * | 10/2008 | Murakami et al. ................ 361/1 |
| 2009/0027856 A1 * | 1/2009 | McCoy ......................... 361/699 |
| 2009/0126910 A1 * | 5/2009 | Campbell et al. ........ 165/104.33 |
| 2009/0188264 A1 * | 7/2009 | Fair et al. ...................... 62/113 |
| 2009/0207567 A1 * | 8/2009 | Campbell et al. ............ 361/696 |

\* cited by examiner

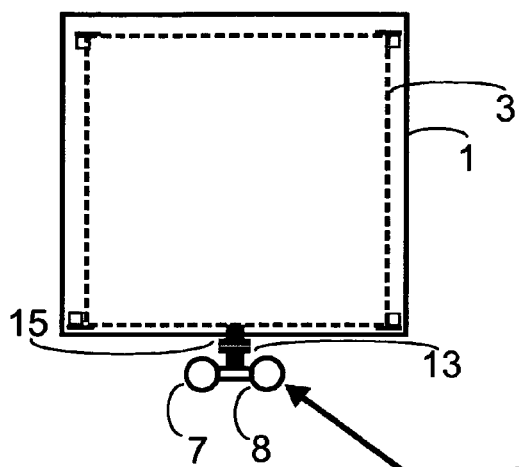
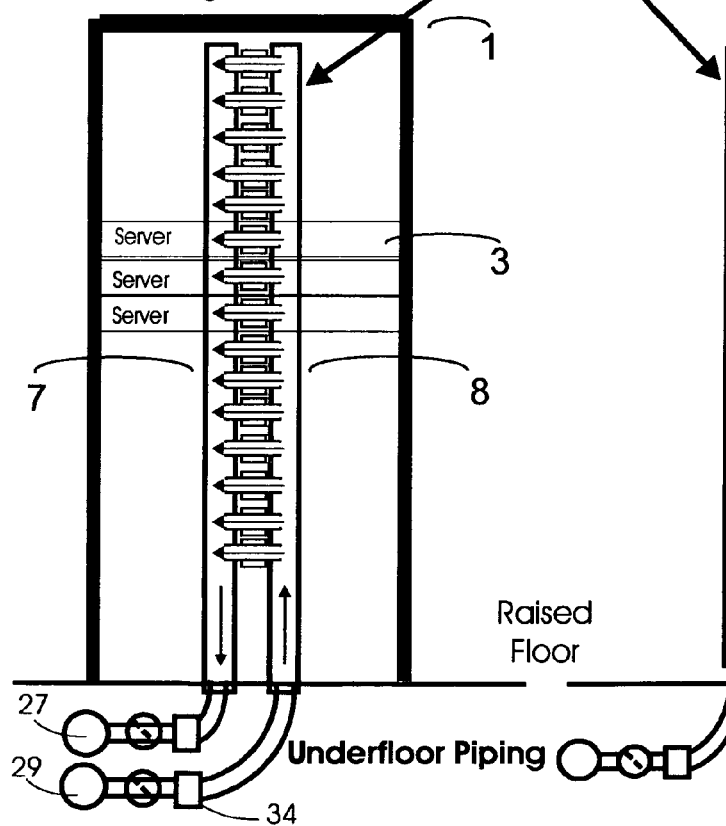
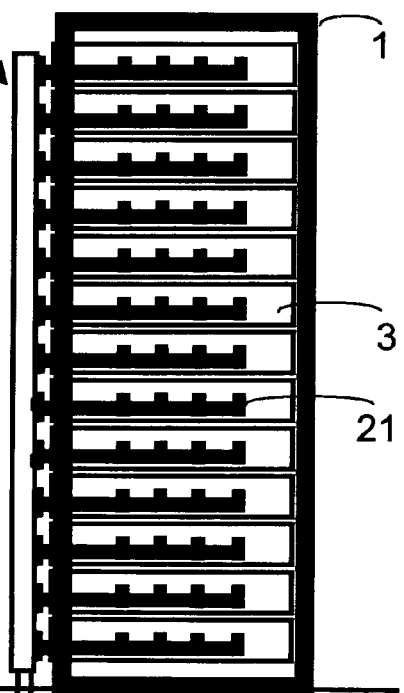

Cooling Fluid Heat Transfer Assembly

HIGH EFFICIENCY HEAT REMOVAL SYSTEM FOR RACK MOUNTED COMPUTER EQUIPMENT

CLAIM OF PRIORITY

This patent application claims priority from provisional patent application, Ser. No. 61/124,351, filed on Apr. 16, 2008.

BACKGROUND

Conventional data centers occupy large rooms with the requirement of controlled environmental conditions. The data storage and processing equipment generally takes the form of servers, storage arrays, network equipment such as routers, switches and other heat producing computer equipment, which are mounted in standard rack cabinets, and the cabinets being arranged in a series of rows in the room. It is essential to cool rack mounted computer equipment to remove the excess heat generated by their processors and other components, so complex air conditioning systems are required to maintain the desired temperature and humidity in the room. These computer room air conditioning units have large power demands in addition to the computer electrical loads, to the extent that in some cases it is the capacity of local electricity grids which place limits on the maximum size of data centers, thereby limiting its ultimate growth potential.

The internet has caused an ever increasing demand for data storage and processing capacity. Particularly in recent years a massive growth in Internet services such as streaming of high quality video content has resulted in a corresponding massive growth in the capacity and performance demands placed on data centers serving this content. The volume of corporate data that must be securely stored in data warehouses also continues to grow rapidly. Corporate and government computer systems have also increased exponentially.

Further, the ongoing trend of increasingly more powerful CPUs along with multiple CPUs per server, combined with smaller form factor servers (i.e. 1U rack mounted servers and blade servers) has exacerbated the amount of heat produced (and the need to cool them) in rack mounted computer equipment by tenfold or more, over the last few years.

It is now common to have a 1U server (1U=Rack Unit which is 1.75' high) that uses 500-1000 W of power and emits 1500-3000 BTUs of heat. This requires extremely powerful high speed fans that are limited in size by the height of the 1.75' server case. These fans require a lot of power to generate sufficient high velocity air flow to cool the internal heat producing components of the server. This fan energy becomes a significant part (5-10%) of the energy used by the server and increases the overall energy usage in each server and therefore in the data center.

In addition, it also means that when a computer rack cabinet is filled with 40 of these 1U type servers it can require 20-40 KW of power and can require 60,000-120,000 BTUs (5-10 tons) of cooling for a single rack. (The above also applies to blade servers which are designed to house as many or even more CPUs per rack) This heat density is far beyond the cooling capabilities of most raised floor data centers.

This not only means that it limits the amount of high density racks in the data center, since it raises the average power per square foot in the room beyond the ability of the cooling systems. This also results in higher and higher airflow rates in the data center cooling units in an attempt to provide sufficient cold air to each rack via the raised floor air flow. Therefore more fan energy is required to try to provide sufficient airflow to try to cool these higher density heat loads, (in addition to the actual higher BTUs cooling loads) resulting in more overall energy being used by the more powerful internal fans of the servers, plus the high fan energy of the cooling units to provide enough cold air to the high density servers.

This invention is able to effectively overcome the inherent limitations of air flow based cooling of high density servers. It also improves the overall energy efficiency of the servers and the data center cooling systems by lowering the overall amount of fan energy required. In addition, it also lowers the amount of space required on the data center floor by cool systems since the majority of the heat would be removed via the fluid piping assembly contained within the rack cabinets.

Providers of data center technology have responded to the demand by increasing processor and data storage density. However, despite improvements in processor efficiency, increases in processing power increases the heat generated by the servers' processors and it becomes difficult to effectively cool the processors using conventional approaches because of the load that is put on the air conditioning systems and subsequent costs.

Limitations in the ability to cool processors place serious overheating limits on the capacity of data centers, which if exceeded can cause overly hot servers which potentially will lead to malfunctions, reduced mean time before failure (MTBF) and unexpected thermal shutdowns.

Current industry practice for heat removal from most modern computer equipment are based on internal fans forcing ambient air thought the computer system cabinet. The majority of heat generating internal components (i.e. main CPU processor chips and Power supplies) have attached heat sinks that transfer the heat to the air by the use of fans forcing air through the computer chassis. This requires that the air in front of the computer is relatively cool (65-75° F.). Warmed air is exhausted out of the back of the computer (approximately +20-30° F. warmer, at 85-105° F.) and then is drawn back into a cooling system. In addition, multiple computers are usually mounted together in a cabinet (rack) to save floor space, so that the heat buildup is high within the rack.

Racks now can hold enough servers and CPUs so that the power per rack can easily reach 30 KW, which produces over 100,000 BTUs of heat. Using air as a means of heat removal is becoming extremely problematical to effectively cool the servers, and very energy inefficient. Moreover, multiple racks are lined up in rows, arranged in so called "Hot Aisles and Cold Aisles" to improve the ability and efficiency cooling of the room. Over the past few years the average power per computer server has risen and the number of servers that can fit into each rack has increased dramatically. The average heat load in a computer data center has risen from 35-50 W/sf to 350-500 W/sf and rising. This is a known and growing problem in modern computer data centers. This is commonly known as a High-Density configuration where the heat load can be as high as 50 KW per rack and rising.

There are various types of computer cooling systems. i.e. chilled water, glycol/condenser water and Direct Expansion. All of these essentially have to use the same ultimate heat transfer path—by cooling and circulating air in the enclosed computer room (or enclosed rack) so that there 65-75° F. air available at the intake of the computer.

This airflow based heat transfer process is relatively inefficient for multiple reasons: Air is an inefficient conductor of heat when compared liquids or solid metal. The warm air has to travel a large distance from heat source (the internal components of the computer), out of the back of the computer rack, into the ambient air in the computer room, before it can be circulated back to the cooling coils of the cooling unit.

There have been recent improvements that have reduced the distance from the computer to the cooling coil, generally called "close coupled cooling" wherein the cooling coil in placed in or above the row of cabinets so that there is a much shorter distance and the process is more efficient. There are also cooling systems that the cooling coil is part of the rack cabinet that are fully enclosed to further improve the heat transfer process.

All of these improvements are based on the need to support the current practice of using forced airflow through the computer equipment as a required part of the heat transfer process, since this is how computer equipment is made today.

The current practice of rack mounted computer equipment is based on a common standard of all computer and computer rack enclosure manufacturers, so virtually all rack mounted computer equipment can fit into a rack and the airflow is front to back.

While it is well know that air cooling is a very inefficient method of heat removal from computer systems, the current industry practice is still based on this because of the simplicity of installing a server into any location without any direct connection to the cooling system.

Some manufacturers of cooling equipment have tried to improve the efficiency of air cooling by relocating the cooling units to be in close proximity to the computer. This is generally referred to as "close coupled cooling" and involves locating the cooling coils near or in the computer rack. This is an improvement, since the air does not have to travel as far as traditional room cooling systems, but still requires that air be used as the heat transfer medium, which is not as effective or as efficient as a liquid or solid metal conductor for transferring heat.

It is known that the thermal conductivity of water is much greater than that of air. Recently, providers of data center equipment have tried to use direct liquid cooling as an alternative to the traditional air-cooling. Chilled water or any other cooling liquid is piped directly into the interior of the computer chassis to the heat producing components such as the CPU. This requires specialized hardware and plumbing for each server and in the cabinets and/or racks in which the servers are mounted to remove heat more efficiently.

However, direct fluid based cooling (to the interior of computer equipment) is not very practical because it involves fluids within the computer equipment and the attachment of hoses and piping which could leak into the computer equipment. This invention overcomes this problem by keeping all fluids external to the computer equipment, but avoids the limitations of using air as the heat transfer medium, thus allowing the continued use of existing industry standards for rack mounting of computer equipment into cabinets without introducing any fluids into the computer equipment.

SUMMARY OF INVENTION

The present invention is generally focused in a new approach to cooling electronic equipment and particularly application in cooling heat producing components in computer equipment found in data centers, such as servers, disk storage arrays, network equipment which contain (electrical or optical) processors, CPU's, RAM, other microchips, hard drives, power supplies, etc. The focus of the current invention is to use a conducting element, such as a solid, for example copper, aluminum, gold, or any super heat conductive alloy to conduct heat or transfer heat from a heat producing electronic component (e.g. a semiconductor device) to a liquid such as water, which isolates the liquid from the heat producing component. Multiple interior heat conducting elements, composing the solid heat transfer medium, can be used to conduct heat from multiple heat producing components within the computer equipment to an exterior heat transfer flange which mates to the flange on the rack mounted cooling fluid heat transfer assembly.

With the current invention, the heat can be efficiently transported away from the heat producing component(s) by the heat conducting element, as the heat transfer medium, to a piped cooling liquid, without the need to pipe the cooling liquid internally to the heat producing components within the computer equipment. In the data center environment, the cooling liquid can subsequently be used to transport the heat away from the vicinity of the data center equipment, therefore the air conditioning requirements for the data center can be significantly less.

The cooling liquid may be water from any continuous source of cool liquids or from server room chiller systems. In some embodiments the water (or other cooling liquid) flows through the conduit past said heat transfer mediums to remove heat from its source. For instance, the cooling liquid may be pumped through the conduit or piping. External cooling systems will operate more efficiently as a result of the invention. The "Entering Water Temperature" EWT of the chilled fluid supply can be substantially higher than the typical 45°-55° F. that is used to feed the traditional "Computer Room Air Handlers" CRAHs. This will result in a substantial decrease in the amount of chiller energy required to cool the fluid. It may even eliminate the use of the chiller during times (or areas) where the outside air temperature is at, or below 60° F.

Depending on the outside air temperature, it may be possible to operate the system with minimal or no compressor based cooling. In effect, it may be possible to remove heat by using 70-80° F. Entering Water Temperature, since the heat source (i.e. CPUs' Power supplies etc) would be virtually directly coupled (via the solid heat transfer conduit) to the circulating fluid. It is possible to operate without any energy being used to operate a chiller compressor if the outside air is 60° F. or below. It can operate with limited compressor operation at 80° F. or below. Only when the outside air is above 80° F. will the unit require compressor operation to lower the fluid temperature.

While some conventional fluid chiller systems have a so called "economizer" mode, it operates only if the outside air temperature is below 35° F. for no compressor mode, and only below 50° F. for partial compressor mode operations.

All of the temperatures listed above are non-absolute, but shown for relative potential operational improvements.

The heat transfer mediums may be in conductive thermal contact with the heat producing elements via physical contact or with a heat sink that is in physical contact with the actual heat producing component. The use of thermal grease may also be applied to this invention to enhance the heat transfer from source to the heat transfer medium.

The heat transfer medium may be metallic or other materials which have the properties of being highly conductive of heat. In some embodiments, however, they may be non-metallic.

In some embodiments the heat transfer mediums maybe hollow, or contain holes, if for instance, are more efficient at transferring heat than solid conductors. In some embodiments the heat transfer medium inside computer equipment may be a combination of solid and hollow metal or other material, the hollow portions of which could be completely sealed and contain a fluid to aid in conducting heat from the heat conducting components to the exterior flange. The size and shape of the internal heat conducting components can vary depending of the type and design of the computer equipment components, but would always be terminated at the exterior of the computer equipment case by a flange which would mate with the flange on the cooling fluid heat transfer assembly mounted on or in the rack cabinet The heat producing components which can be cooled with the current invention may be semiconductor components, such as processors (e.g. CPUs, graphic processors, optical processors), memory chips, server fabric switches, solid state storage devices or other microchips, or other components such as magnetic, optical or combination storage devices (e.g. hard drives) and power supplies.

Cooling liquid may be returned from the cooling fluid heat transfer assembly to through a heat exchanger which cools the liquid before it is returned to the rack. The heat exchanger may be cooled by a mechanical chiller system and may be located remotely from the processor racks. Alternatively a mechanical chiller system is not required based upon the ambient temperature of the exterior environment, or a combination of mechanical chiller and an exterior fluid cooler to minimize the energy use of the chiller compressors.

BRIEF DESCRIPTION OF THE DRAWINGS

FIG. 17 illustrates a side view of cooling fluid heat fluid transfer assembly mounted on the rear of an open rack on raised floor, mechanically and thermally mated via flangess, to multiple computer equipment cases containing internal heat transfer conduit.

FIG. 18 illustrates a rear view of cooling fluid heat fluid transfer assembly with multiple horizontal fluid passages mounted on the rear of an open rack on raised floor, mechanically and thermally mated via flanges, to multiple computer equipment cases containing internal heat transfer conduit.

FIG. 19 illustrates a top view of cooling fluid heat fluid transfer assembly with multiple horizontal fluid passages mounted on the rear of an open rack on raised, floor mechanically and thermally mated via flanges to multiple computer equipment cases containing internal heat transfer conduit.

DETAILED DESCRIPTION

Hereinafter, embodiments of the present invention will be described in detail with reference to the accompanying drawings. Note that components having the same function are denoted by the same reference symbols throughout the drawings for describing the embodiments, and the repetitive description thereof is omitted.

Figure 1:
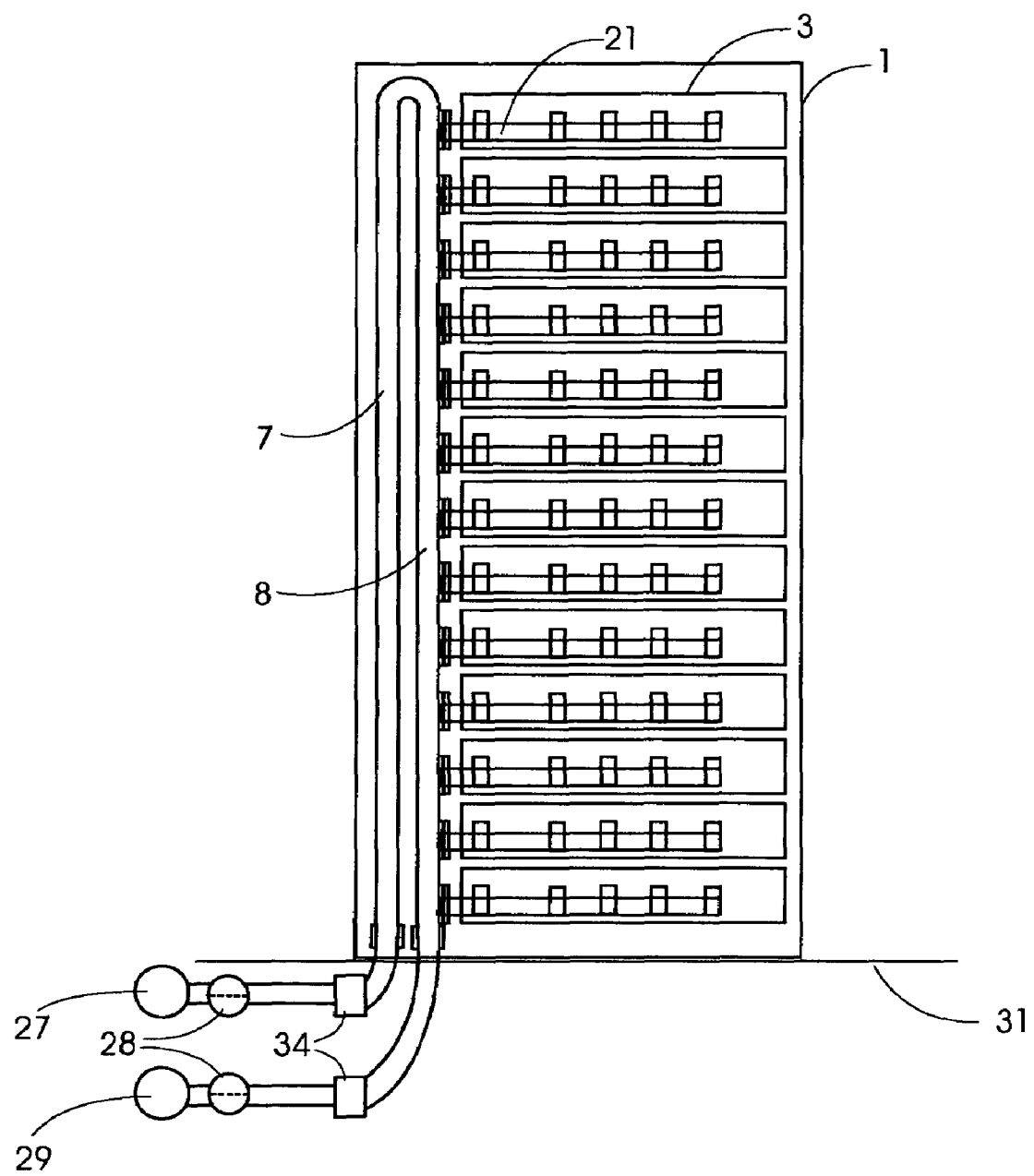
FIG. 1 illustrates a side view of cooling fluid heat fluid transfer assembly mounted in a rack cabinet on raised floor, with under floor piping and shutoff valves, which is mechanically and thermally mated via flanges, to multiple computer equipment cases such as of a server containing internal heat transfer conduit.

The preferred embodiment of the cooling system for the rack-mount computer equipment such as a server system schematically shown in FIG. 1 and includes: a rack cabinet 1; a plurality of computer equipment cases 3 (such as typically used for servers) provided with a heat transfer conduit 21 in the server(s), and the like; a cooling fluid heat transfer assembly located within the rear of a rack cabinet which may be composed of a at least one outflow return warm fluid pipe 7, and at least one inflow cold fluid pipe 8; said piping may be shaped to efficiently transfer heat such as, but not limited to square, rectangular, oval, round shaped pipes and may be coupled to computer room chiller systems through couplings 34 and shutoff valves 28 to pipe connections 27, 29.

Figure 2:
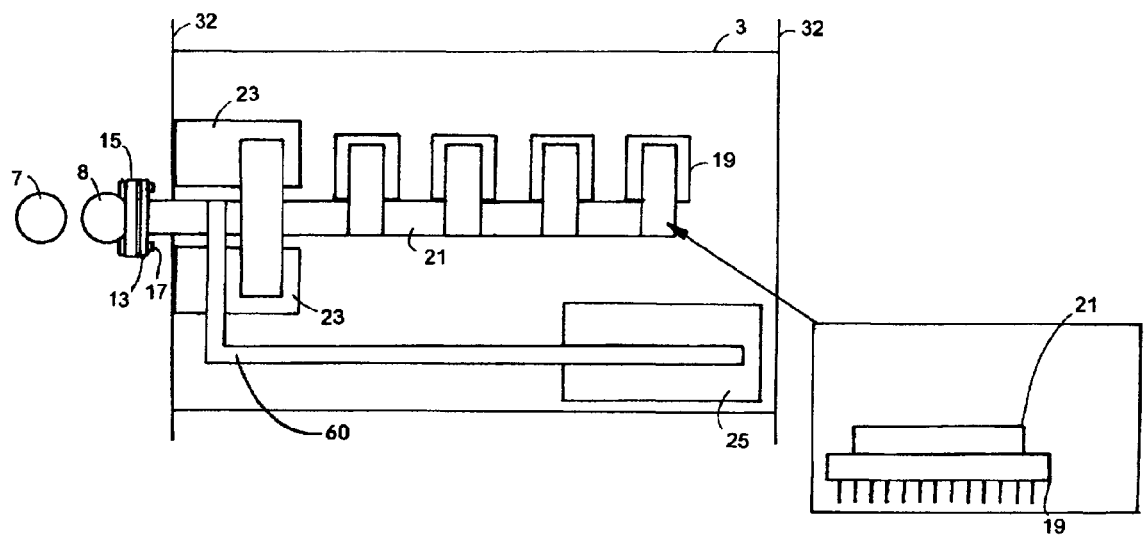
FIG. 2 illustrates a top view of computer equipment case such as of a server, containing internal heat transfer conduit, which is mechanically and thermally coupled to internal heat producing components such as a CPU and power supply. Said internal heat transfer conduit is mechanically and thermally mated via flanges to the cooling fluid heat fluid transfer assembly.
Figure 3:
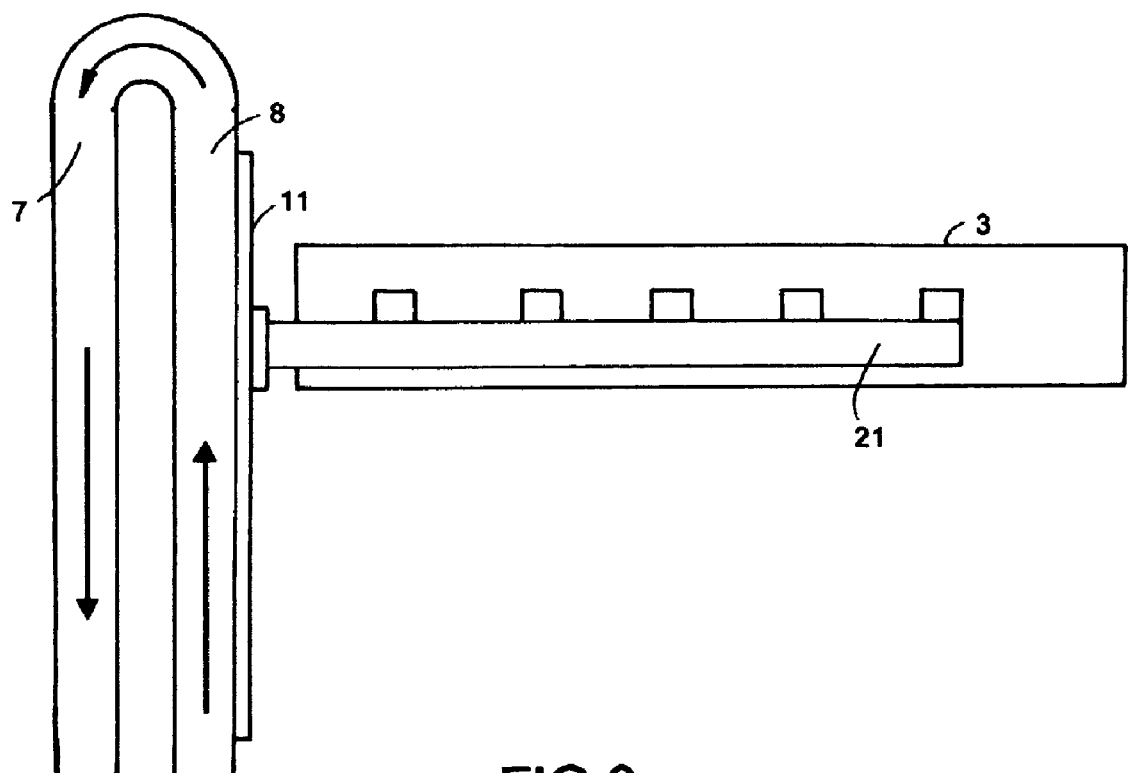
FIG. 3 illustrates a side view of computer equipment case containing internal heat transfer conduit mechanically and thermally mated via flanges, to cooling fluid heat fluid transfer assembly with continuous mating flanges.
Figure 4:
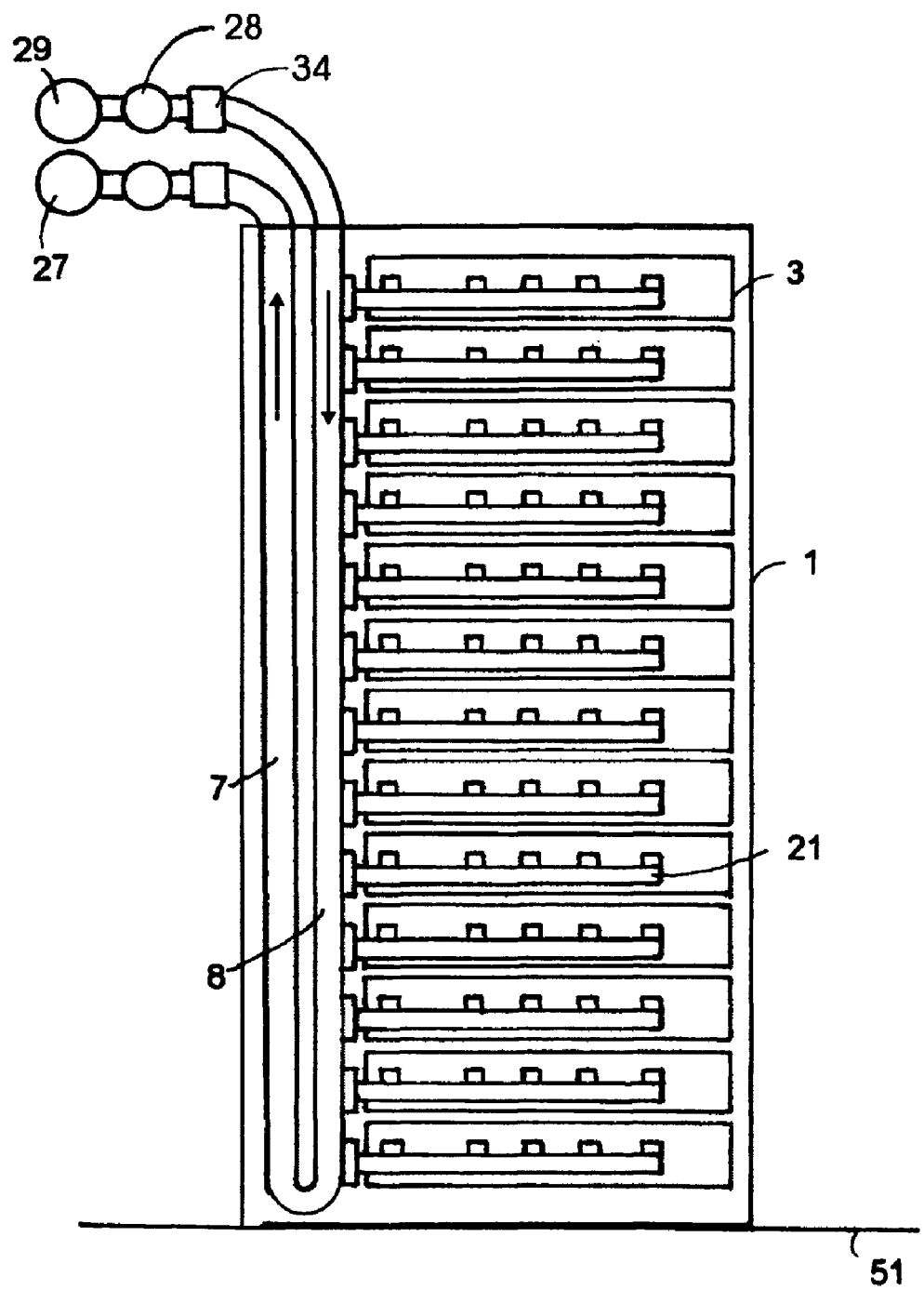
FIG. 4 illustrates a side view of cooling fluid heat fluid transfer assembly mounted in a rack cabinet on non-raised floor with overhead piping mechanically and thermally mated via flanges, to multiple computer equipment cases containing internal heat transfer conduit.
Figure 5:
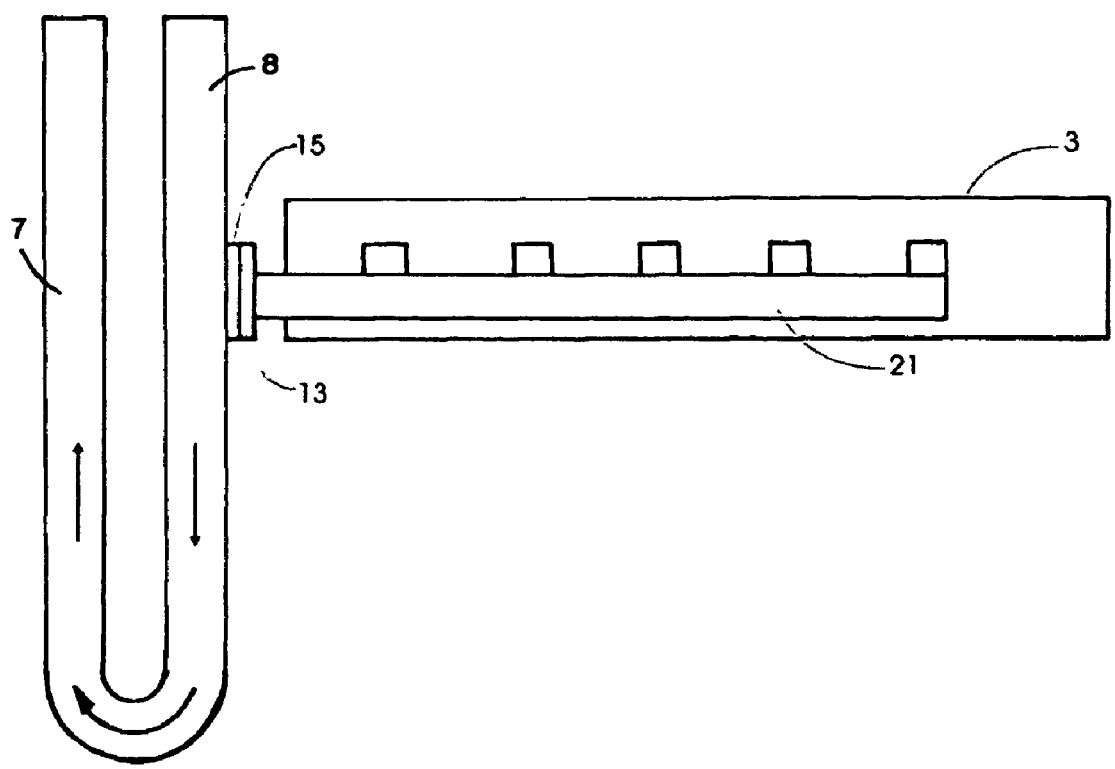
FIG. 5 illustrates a side view of computer equipment case containing top fed internal heat transfer conduit mechanically and thermally mated via flanges, to cooling fluid heat fluid transfer assembly with individual mating flanges.

FIG. 2 shows a computer equipment case 3 (such as typically used for servers) containing the heat transfer conduit 21 which is be in direct thermal contact with heat producing components such as a CPU 19 and power supply 23 and could also extend to other heat producing components such as disk drive 25 via the heat transfer conduit sub-assembly. The heat would travel via the transfer conduit 21 to the flange 13. Flange 22 mates and is affixed with bolts 17 to flange 15 which is attached and thermally connected to the cooling fluid pipe 8 of the rack mounted cooling fluid assembly consisting of 7, 8, and 15.

Figure 6:
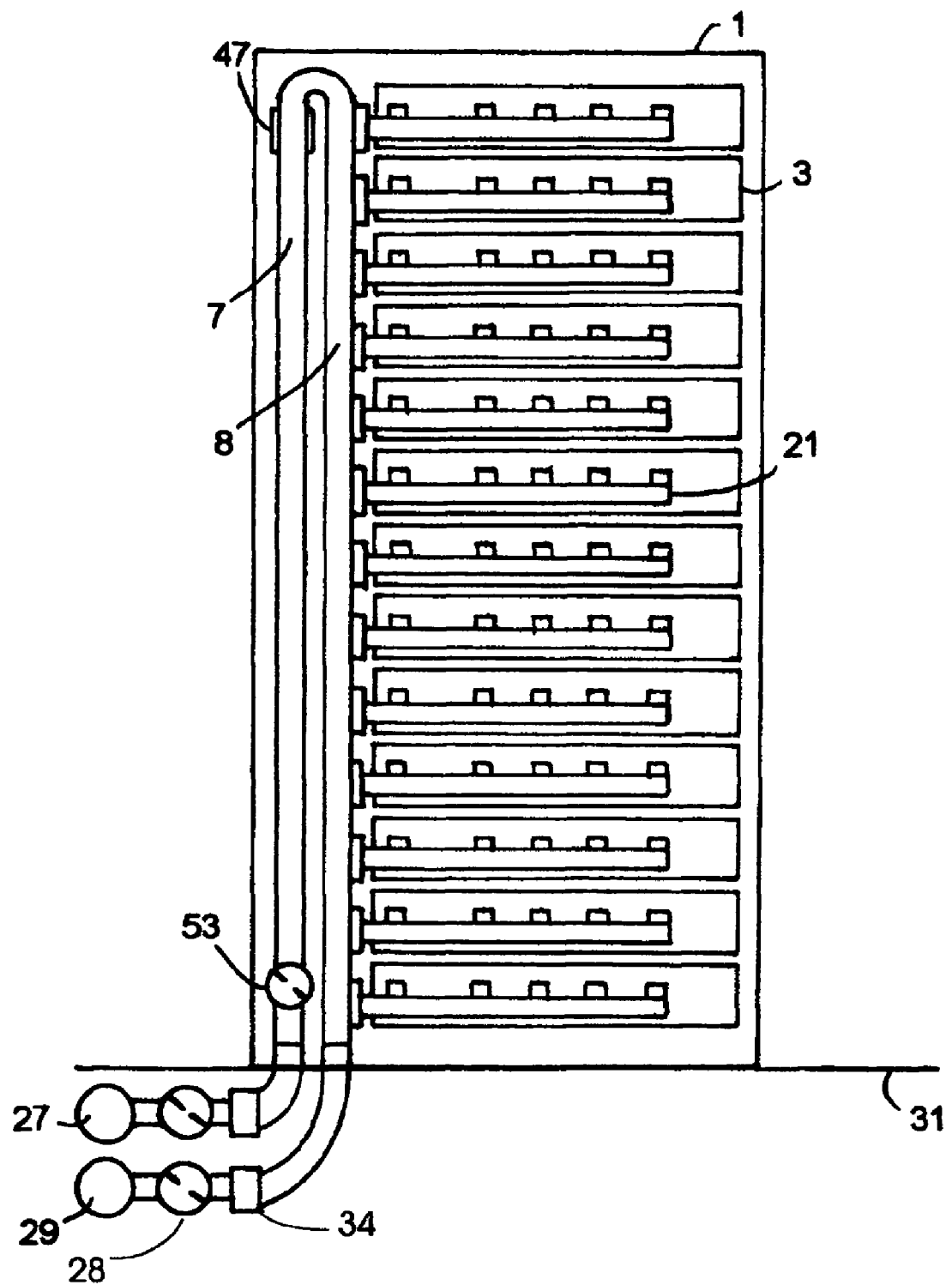
FIG. 6 illustrates a side view of cooling fluid heat fluid transfer assembly with temperature sensor and flow control valve mounted in a rack cabinet on raised floor mechanically and thermally mated via flanges, to multiple computer equipment cases containing internal heat transfer conduit.
Figure 7:
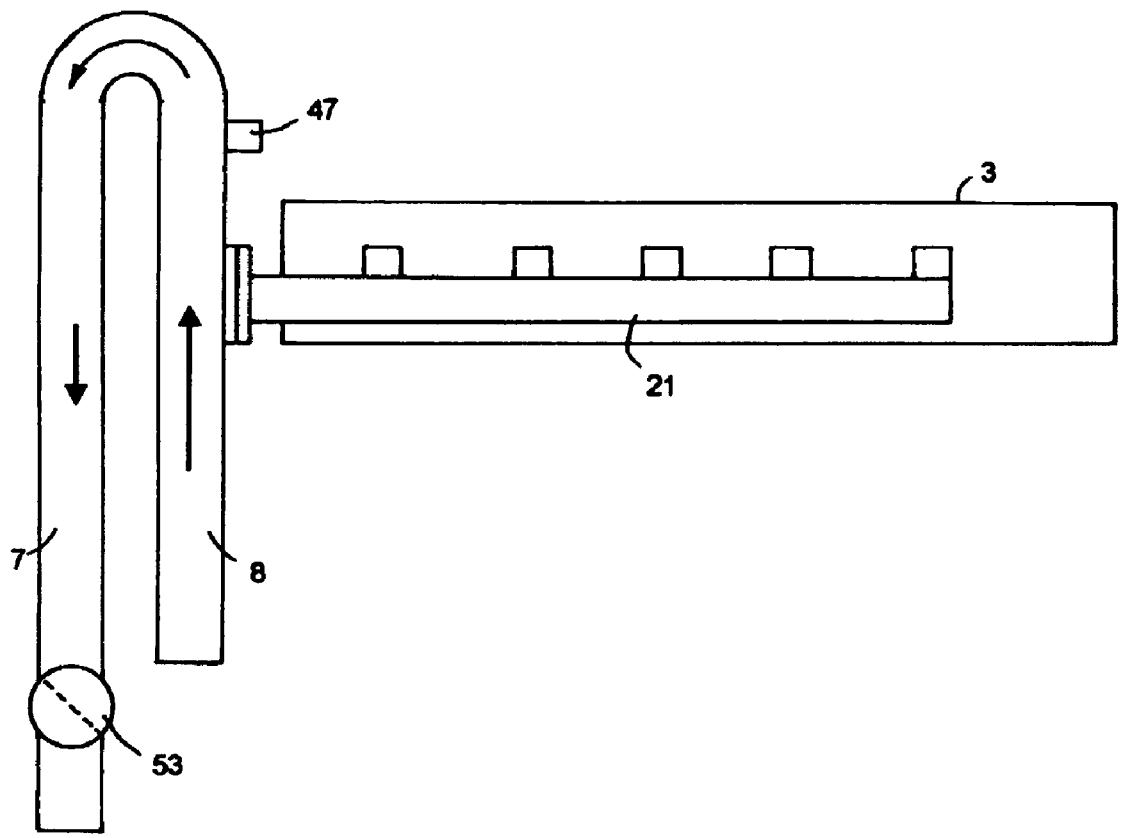
FIG. 7 illustrates a side view of cooling fluid heat fluid transfer assembly with temperature sensor and flow control valve mounted mechanically and thermally mated via flanges, to multiple computer equipment case containing internal heat transfer conduit.

As shown in FIGS. 6, 7, an alternative embodiment is shown, utilizing a temperature sensor 47 which may be located at the end of said inflow cold fluid pipe 8 or alternatively multiple sensors are utilized located in between each server. Said sensor(s) are used to monitor the temperature and control liquid flow quantity via and electronic control package which controls an electromechanical fluid flow control valve 53. The change of fluid flow quantity causes the change in the heat quantity to be removed, and resulting in the change in the cooling performance. The location and type of sensors, electronic control packages and electromechanical fluid flow control valves are not limited to the those shown in FIGS. 6, 7 and can be of any type known to those skilled in the art.

Figure 24:
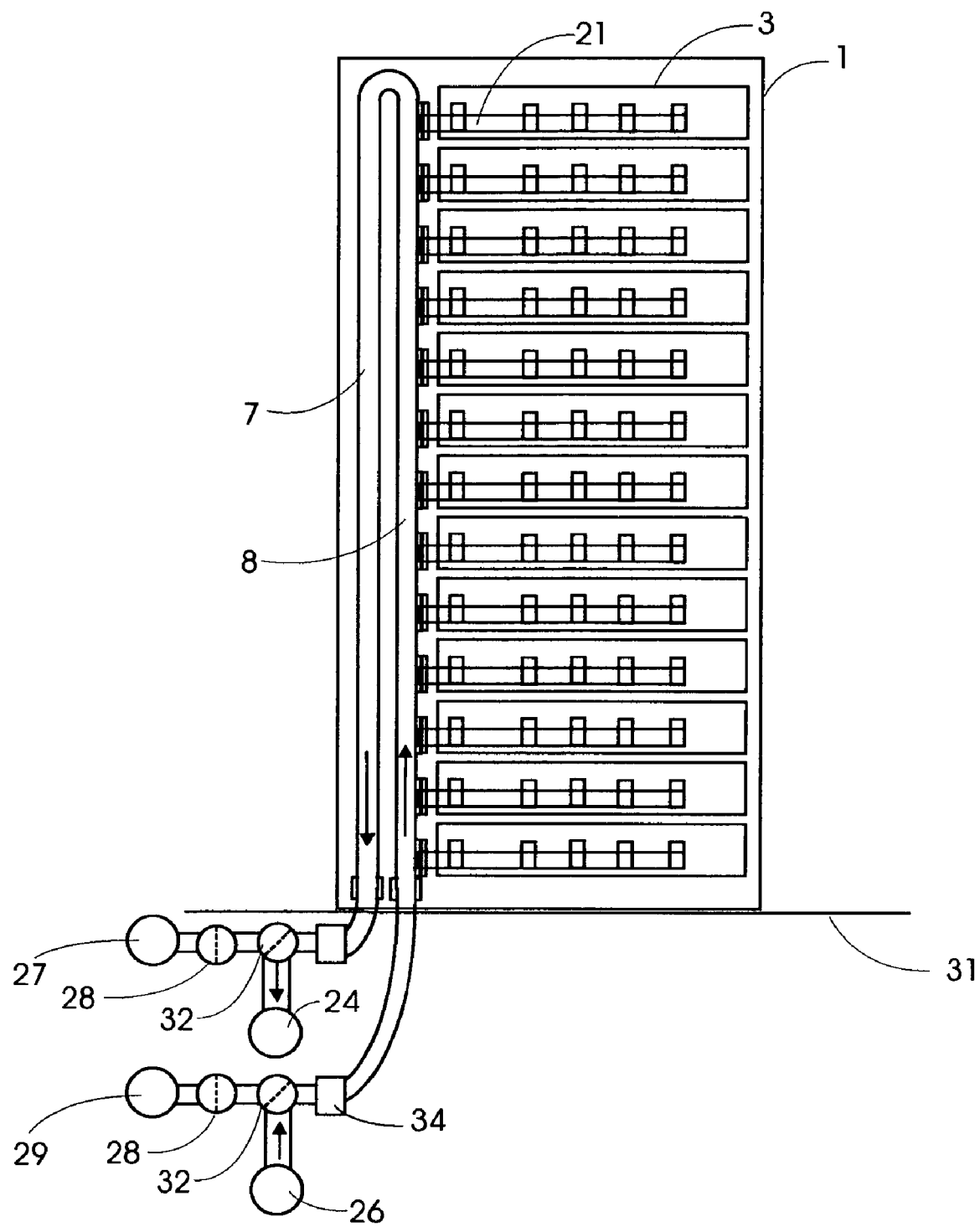
FIG. 24 illustrates a side view of cooling fluid heat fluid transfer assembly mounted in a rack cabinet on raised floor with auxiliary cooling fluid inflow and outflow bypass valves and auxiliary pipes, mechanically and thermally mated via flanges, to multiple computer equipment cases containing internal heat transfer conduit.
Figure 25:
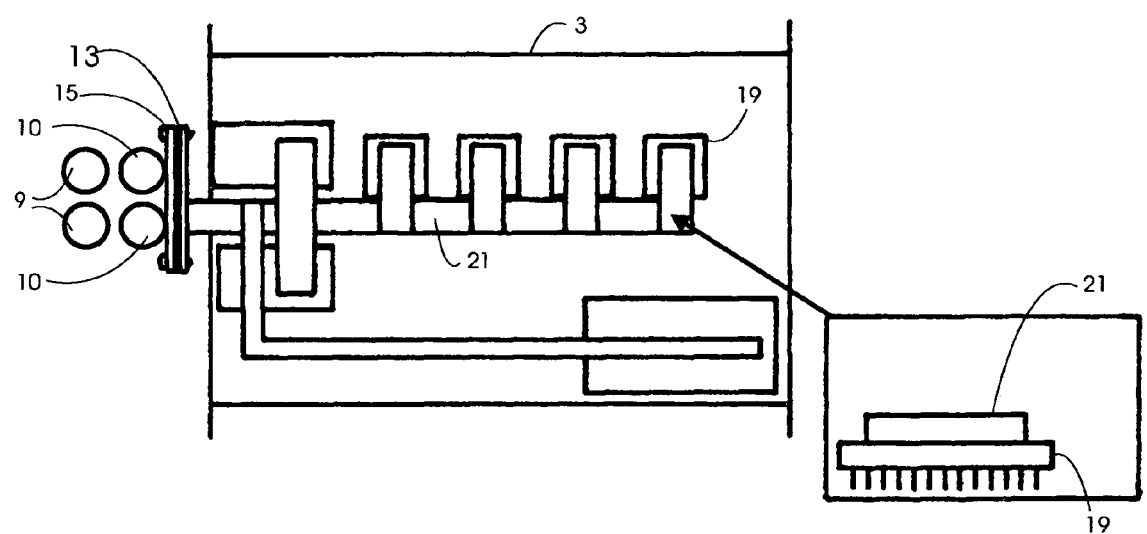
FIG. 25 illustrates a top view of computer equipment case containing internal heat transfer conduit mechanically and thermally mated via flanges, to redundant path cooling fluid heat fluid transfer assembly.

As shown in FIG. 24 in an alternative embodiment of the cooling system for the rack-mount server system, a bypass fluid route is provided and the pumped to the racks. The difference from the configuration in FIG. 1 is that the bypass route is provided to the cooling fluid heat transfer assembly, and bypass flow control valves 32 are connected to the bypass route piping 24, 26 which is connected to liquids at or near outside temperatures during times (or areas) where the outside air temperature is at, or below 60° F.

In one embodiment, the rack cabinet 1, the circulation system of the cooling fluid heat transfer assembly is formed in the mounting direction of the server 3, vertically located in the rear spacing of said rack 1, and the cooling liquid is circulated by means of the circulation pump or by the pressure exerted through conventional chiller systems within the server room. Furthermore, the warmed cooling liquid is returned to the chiller system or an external fluid heat exchanger to cool the circulating cooling liquid. In an alternative embodiment, the cooling system in which a liquid holding tank is provided as a buffer of the main circulation system, the cooling section is incorporated, and the heat exchanger is used to cool the cooling liquid. Also, the main chiller system, the liquid conduit(s), the tank, and the heat transfer medium such as a cooling liquid such as mixture of water and gycol are assembled together to form the cooling unit.

As known to persons skilled in the art, one embodiment of a conventional mechanical chiller system, used for computer rooms are water chillers, which use water or a mixture of water and an antifreeze such as gycol as a heat transfer medium. Water chillers can be either water cooled, air-cooled, or evaporatively cooled or a combination thereof. These chillers typically utilize a mechanical compressor to remove heat from circulating water via a vapor-compression or absorption refrigeration cycle. The chiller water is circulated to Computer Room Air Handlers (a fluid-to-air heat exchanger) which then cools the air within the computer room and then the warmed water is circulated back to the chiller to be cooled again, typically to 45-55 F. The more the compressor runs the more it lowers the water temperature. However, the lower the water temperature, the more energy is used by the compressor. This invention can use higher temperature chilled water (55-70 F) which would lower the compressor energy usage.

In another alternative embodiment the main cooling fluid circulation pipe 29 is connected to the inflow cold fluid pipe 8 of the fluid heat transfer assembly through which the cooling liquid flows and to the outflow return warm fluid pipe 7 to which the warmed cooling liquid exits and is returned to main return cooling fluid circulation pipe 27. A plurality of computer equipment such as servers 3 incorporating the heat transfer medium 21 which in turn is coupled to the cooling fluid heat transfer assembly inflow cooling fluid pipe 8 via flange 15 and heat transfer medium flange 13. Said flanges maybe affixed with either mounting bolts 17, clamps 33, or any other method for removably affixing said flanges known to persons skilled in the art.

The cooling fluid heat fluid transfer assembly which consists of the fluid carrying passages and the mating flanges may formed in different shapes and sizes such as, but limited to round, square or rectangular, by means of extrusion, casting, brazing, welding or any or all in combination, as known to persons skilled in the art.

Next, concrete examples of the cooling system for the rack-mount computer equipment according to the embodiment will be described with reference to FIGS. 1 to 26. FIGS. 1, 4, 6, 8, 16, 17, 18, 20, 21 is a perspective view showing the state where the computer equipment is mounted in the rack cabinet, FIGS. 2, 3, 5, 7, 10, 14, 15, 25, 26 is a perspective view showing the heat transfer medium 21 in thermal contact with heat generating source(s) within the computer equipment 3, 4. Said heat generating sources may be individual components within said rack 1 such as but not limited to CPU(s) 19, power supply(s) 23, storage device(s) 25 such as hard drives. Alternatively, these components may be centralized within said rack 1 such as a centralized power supply providing power to the entire rack with all said server(s) 3 or centralized data storage.

The typical open rack 1 may be square or rectangular in shape and is provided with four posts serving as mount angles at the four corners thereof to which the servers are attached. The cooling fluid heat transfer assembly is arranged vertically along the back of said rack cabinet 1, and the cooling liquid is circulated as shown in FIG. 17-19.

Figure 16:
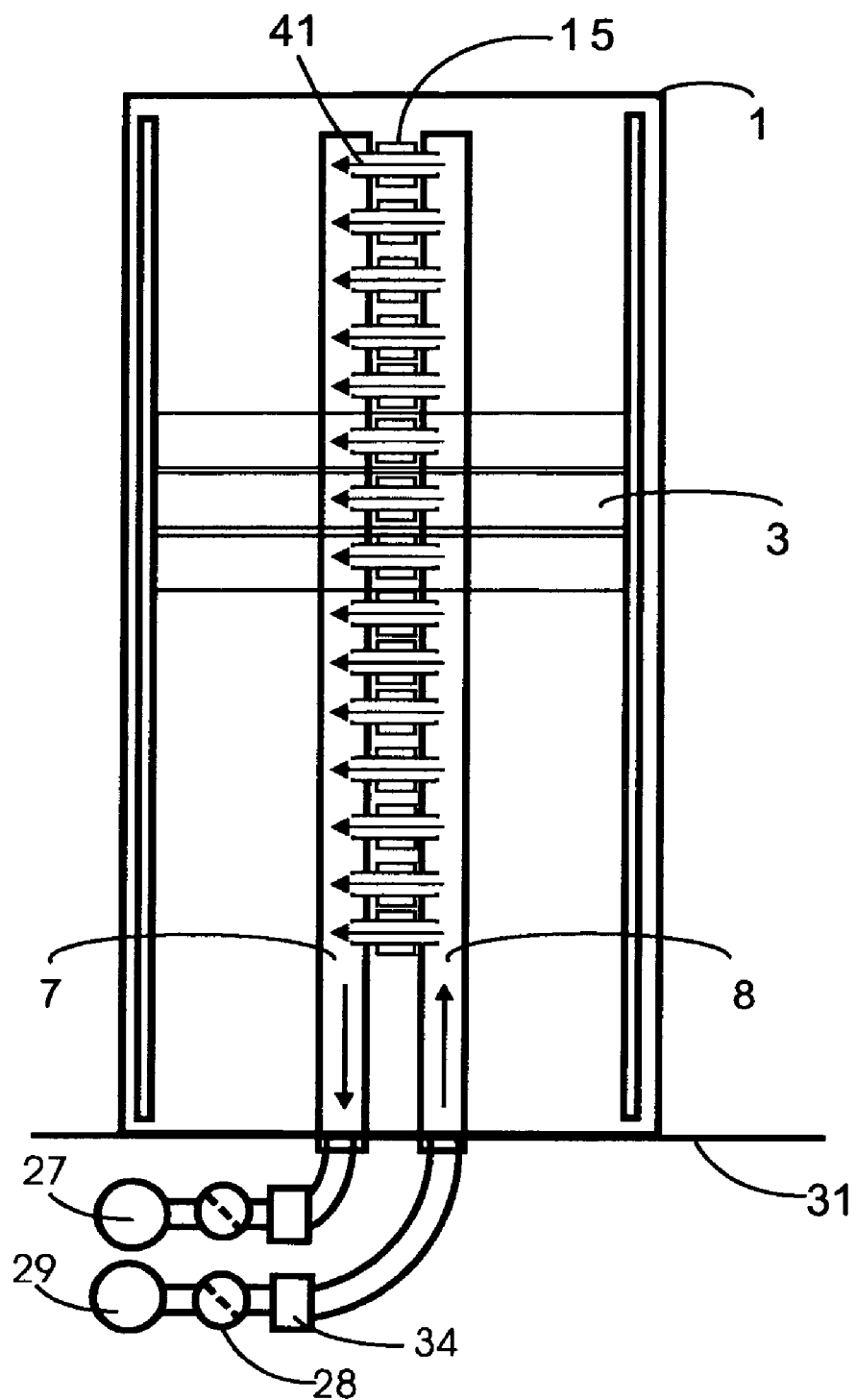
FIG. 16 illustrates a rear view of cooling fluid heat fluid transfer assembly with multiple horizontal fluid passages mounted in a rack cabinet on raised floor, mechanically and thermally mated via flanges, to multiple computer equipment cases containing internal heat transfer conduit.
Figure 22:
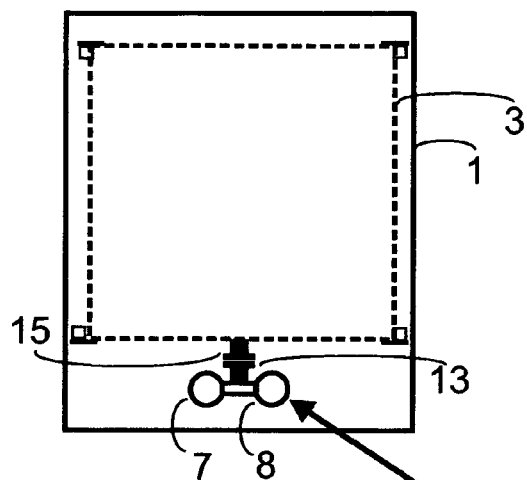
FIG. 22 illustrates a top view of cooling fluid heat fluid transfer assembly with multiple horizontal fluid passages mounted in a rack cabinet on raised floor, mechanically and thermally mated via flanges, to multiple computer equipment cases containing internal heat transfer conduit.
Figure 21:
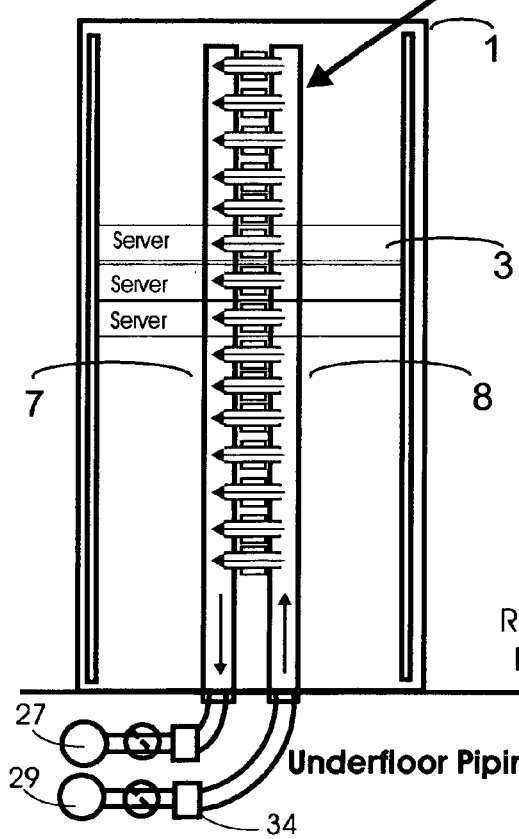
FIG. 21 illustrates a rear view of cooling fluid heat fluid transfer assembly with multiple horizontal fluid passages mounted in a rack cabinet on raised floor, mechanically and thermally mated via flanges, to multiple computer equipment cases containing internal heat transfer conduit.
Figure 20:
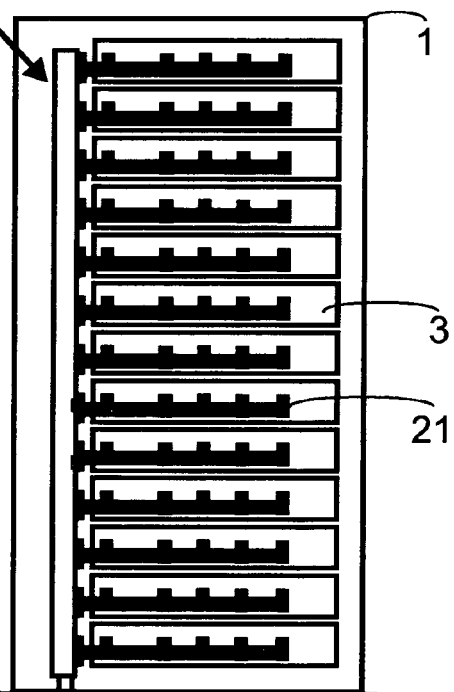
FIG. 20 illustrates a side view of cooling fluid heat fluid transfer assembly with multiple horizontal fluid passages mounted in a rack cabinet on raised floor, mechanically and thermally mated via flanges, to multiple computer equipment cases containing internal heat transfer conduit.
Figure 23:
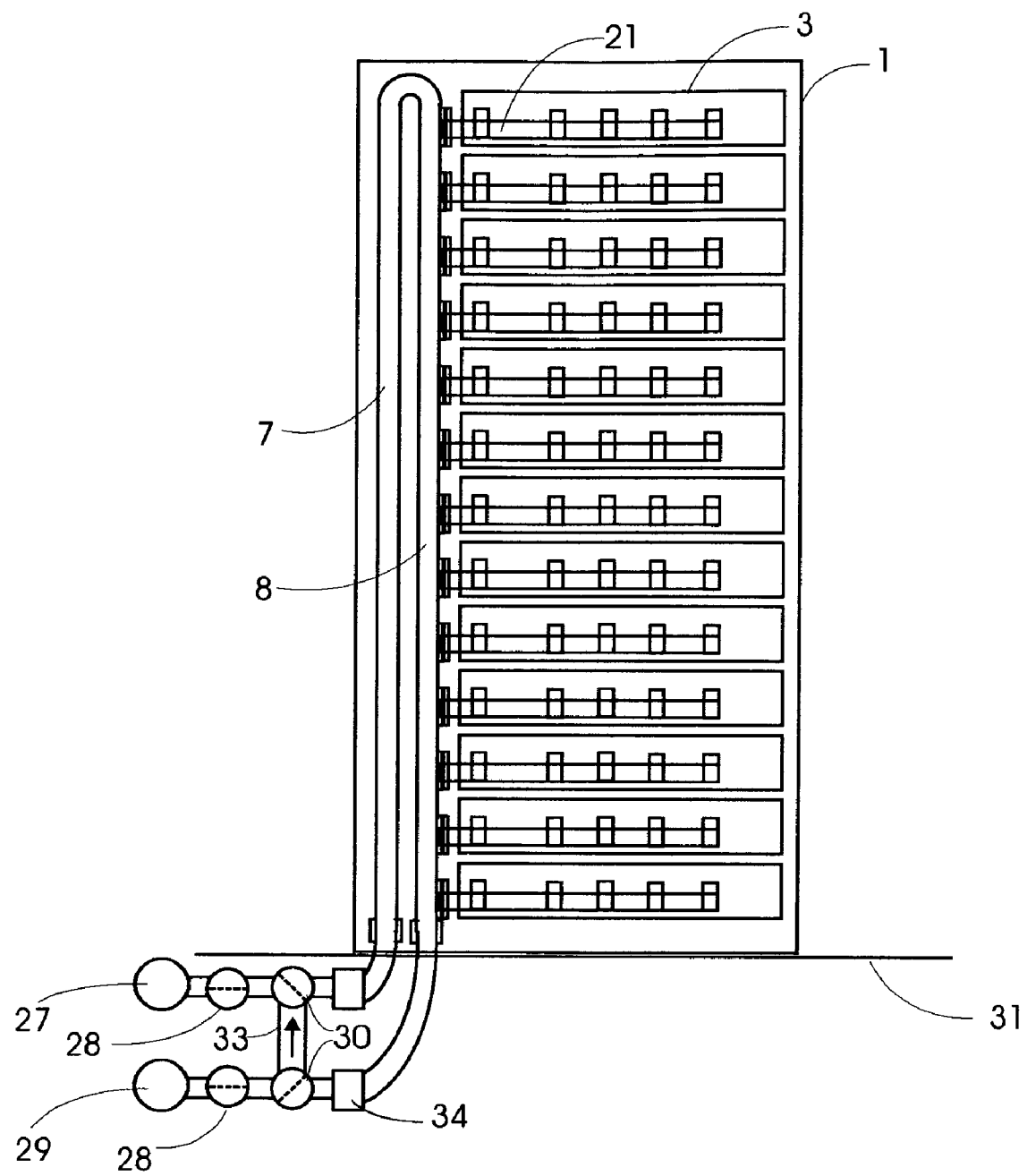
FIG. 23 illustrates a side view of cooling fluid heat fluid transfer assembly mounted in a rack cabinet on raised floor with inflow-outflow bypass valves and bypass pipe, mechanically and thermally mated via flanges, to multiple computer equipment cases containing internal heat transfer conduit.

As shown in FIG. 16, the cooling fluid heat transfer assembly, consists of the outflow return warm fluid pipe 7 from which the cooling liquid is drained and the inflow cold fluid pipe 8 to which the cooling liquid is supplied, and they are arranged with parallel channels 41 allowing separate horizontal conduits mechanically and thermally attached to a joint/flange 15, which mates with the flange on computer equipment such as servers, equipped with an internal heat transfer conduit to transfer heat from internal heat generation components.

In the computer equipment case 3 according to the embodiment, a main board is provided in the server(s) housing and heat-generating components such as CPU 19 are mounted on the main board is coupled to the heat transfer medium/conduit 21. A flange/joint 13, 15 serving as a heat removal point wherein the process of heat transfer is converted from heat transfer via a solid to liquid. The heat transfer medium 21 is a conducting element, such as a solid, for example copper, aluminum, gold, (or any super heat conductive alloy) to conduct or transfer heat from a heat producing electronic component (e.g. a semiconductor device) to the cooling fluid heat transfer assembly 7, 8 through which a cooling liquid such as water is piped from a continuous source of cool or chilled water.

The internal heat transfer conduit 21 contained within the computer equipment case and the mating surfaces in contact with the heat producing components, which ends in a flange external to the computer case, may formed in different shapes and sizes by means of extrusion, casting, brazing, welding or any or all in combination, as known to persons skilled in the art.

Figure 8:
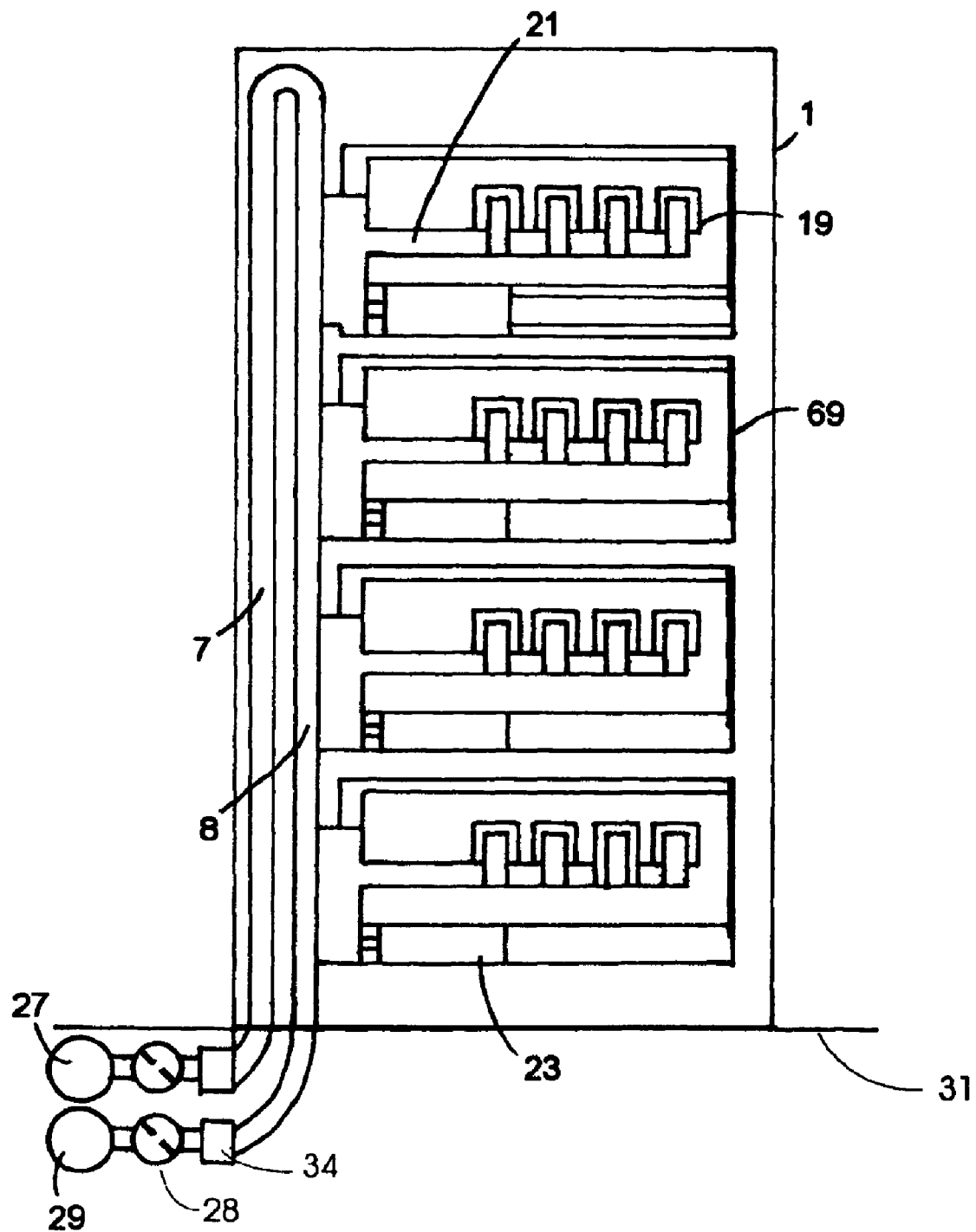
FIG. 8 illustrates a side view of cooling fluid heat fluid transfer assembly mounted in a rack cabinet on raised floor mechanically and thermally mated via flanges, to multiple blade servers or network equipment chassis containing internal heat transfer conduit and server blades or network modules with internal heat transfer conduit.
Figure 9:
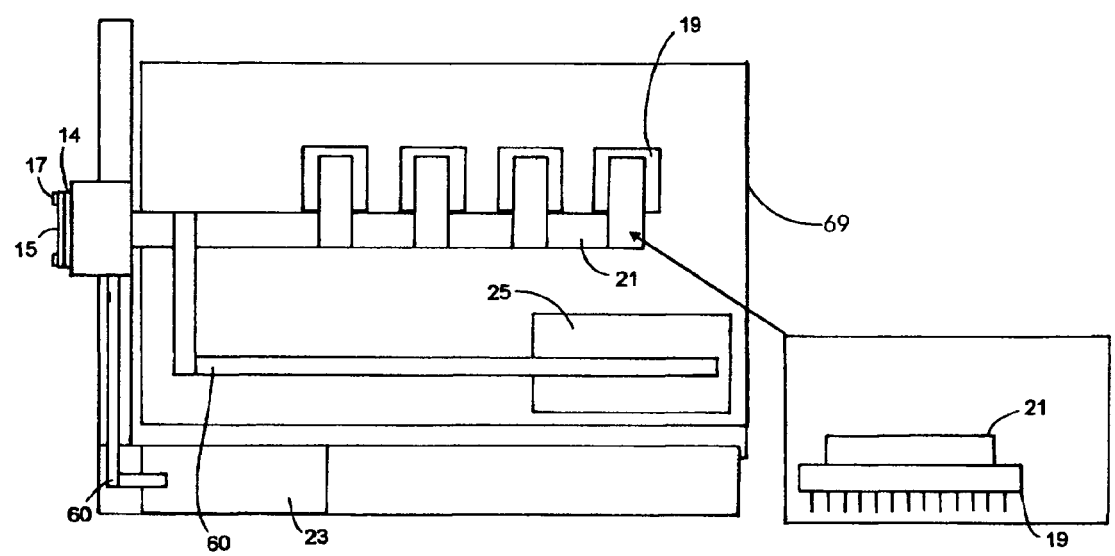
FIG. 9 illustrates a side view blade server or network equipment chassis containing internal heat transfer conduit and server blade or network modules with internal heat transfer conduit.
Figure 10:
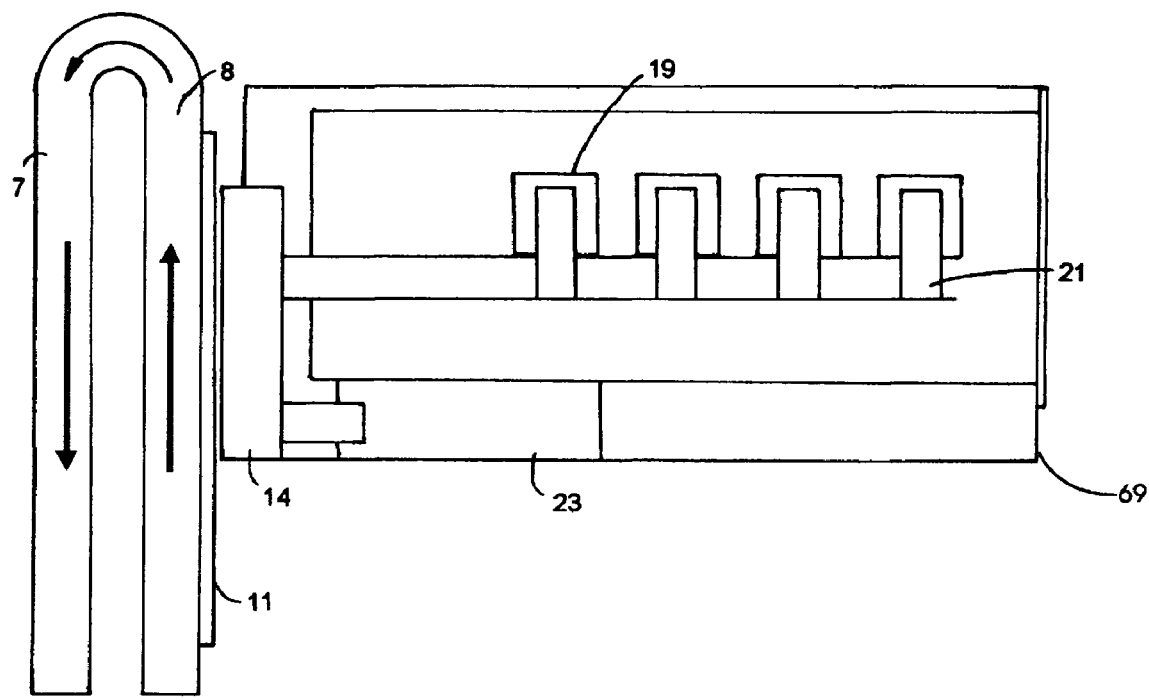
FIG. 10 illustrates a side view of cooling fluid heat fluid transfer assembly mated to blade server chassis containing internal heat transfer conduit and blade modules with internal heat transfer conduit.
Figure 11:
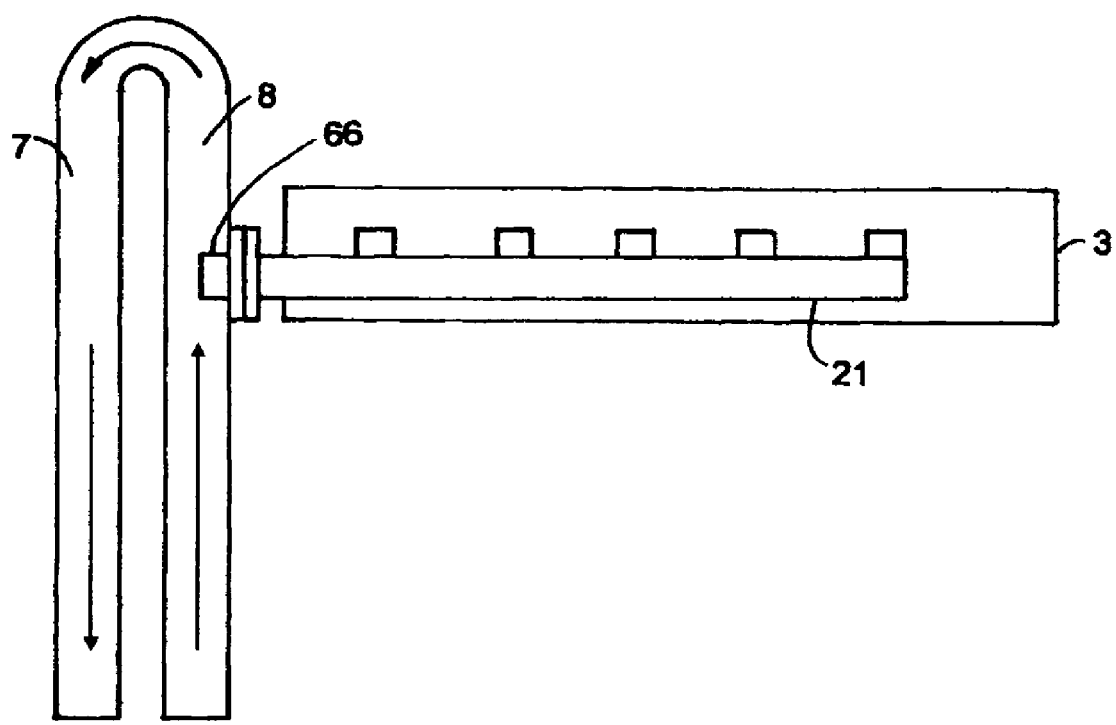
FIG. 11 illustrates a side view of computer equipment case containing bottom fed internal heat transfer conduit mechanically and thermally mated via flanges, to cooling fluid heat fluid transfer assembly with individual mating flanges.
Figure 12:
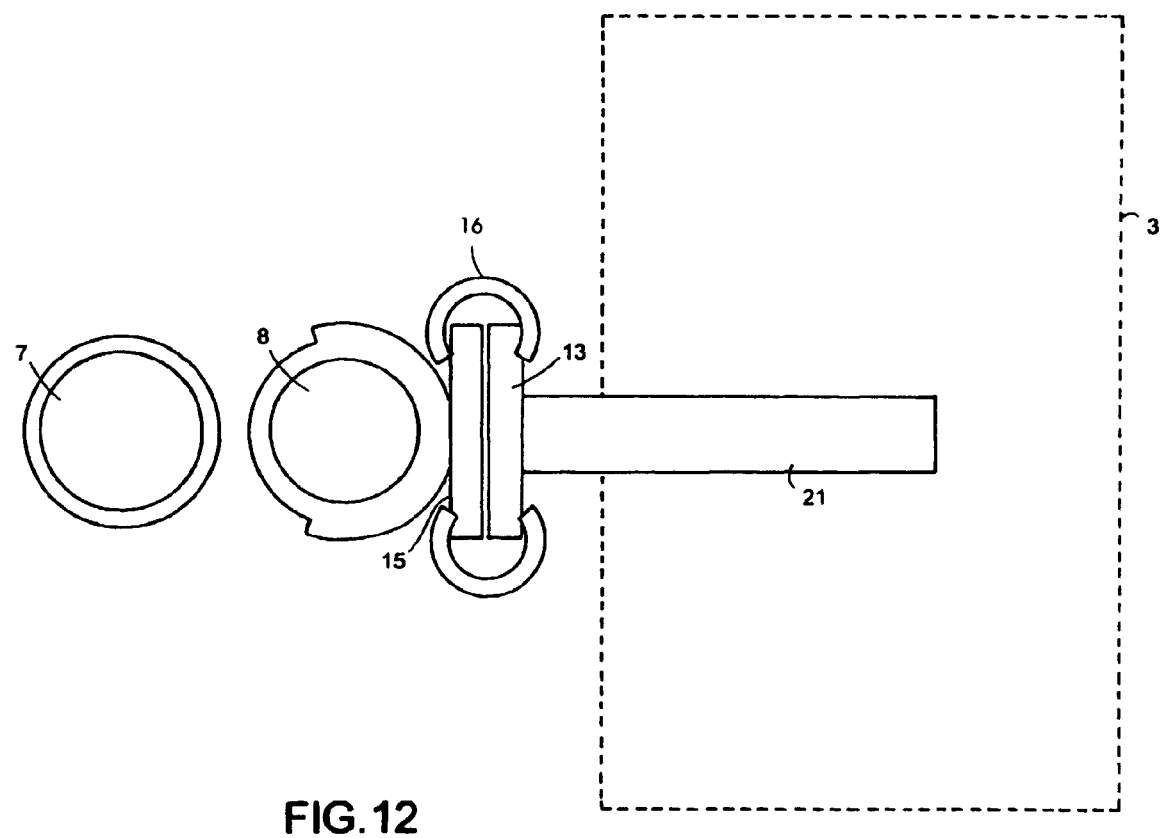
FIG. 12 illustrates a top view of computer equipment case containing internal heat transfer conduit mechanically and thermally mated via flanges, with spring clips to cooling fluid heat fluid transfer assembly.

In a Blade Server configuration, each blade server module is coupled to a backplane or mid-plane within the blade server chassis 69 as shown in FIG. 8-10. Each electronics server includes one or more heat generating devices as is well known in the art. In the preferred embodiment, a thermal transfer system by using a solid medium 21 to remove heat for each electronics server 3 such as but not limited to a blade server 69 as shown in FIGS. 8, 9, 10, a heat transfer medium 21 with a sufficiently high heat conductivity coefficient in physical contact with heat generating components: CPU 19, power supply 23, such that heat generated by each heat generating device on the electronics server is transferred through the solid towards the opposite end of the medium extending outside said server wherein said outer end is acts as a heat sink depositing excess heat through the heat flanges 14/15 to a fluid pipe 8 of the cooling fluid heat transfer assembly.

In an alternative embodiment, FIG. 8-10, would represent computer network equipment such as routers and switches arranged in a chassis 69 with router and switch cards contained within the chassis. Said router and switch cards, would contain a heat transfer medium 21 with a sufficiently high heat conductivity coefficient in physical contact with heat generating components: CPU 19, power supply 23, such that heat generated by each heat generating device on the electronics server is transferred through the solid towards the opposite end of the medium extending outside said server wherein said outer end is acts as a heat sink depositing excess heat through the heat flanges 14/15 to a fluid pipe 8 of the cooling fluid heat transfer assembly.

Figure 13:
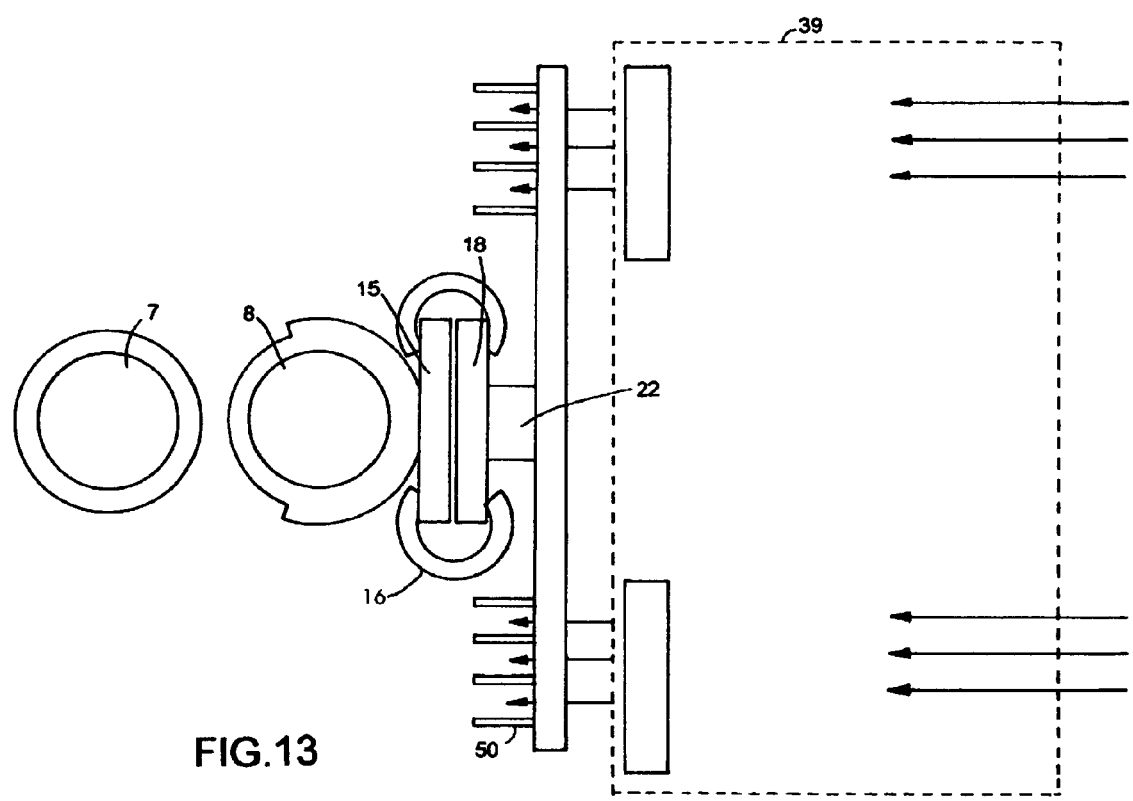
FIG. 13 illustrates a top view of airflow heat transfer module in line with typical air flow computer equipment case, mated with spring clips to cooling fluid heat fluid transfer assembly.
Figure 14:
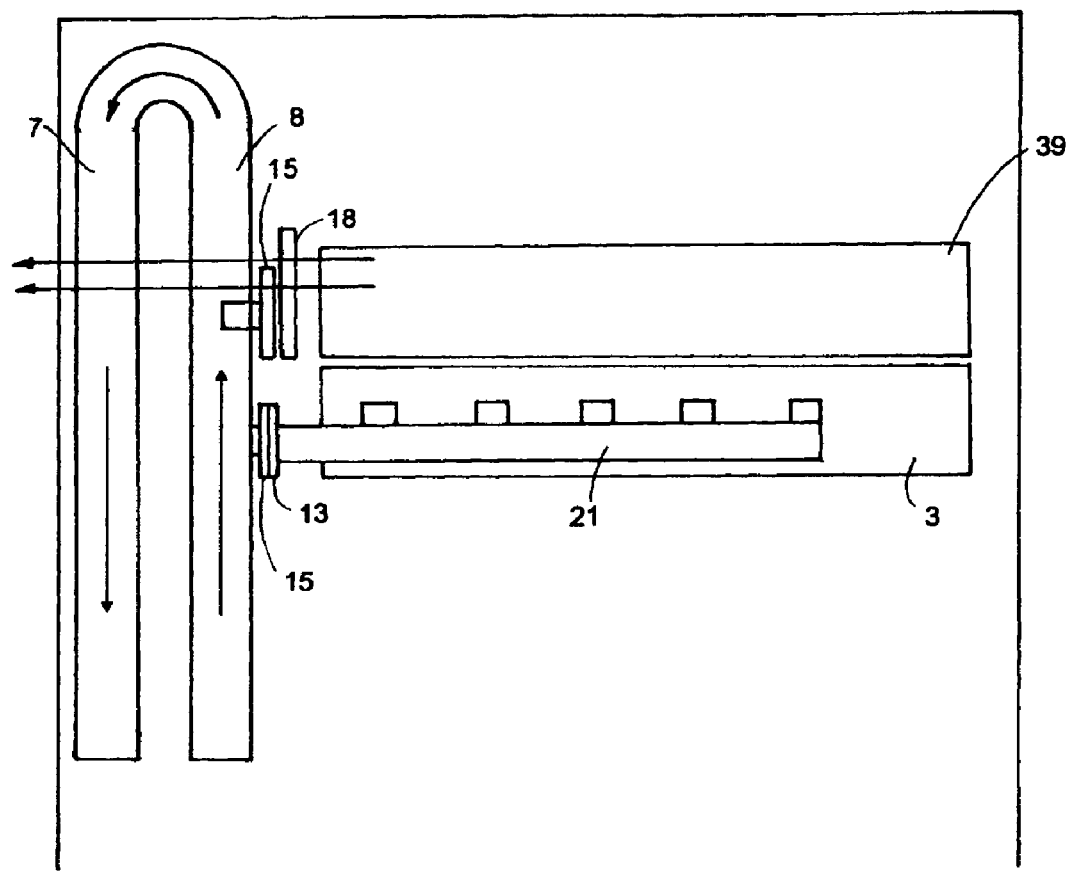
FIG. 14 illustrates a side view of cooling fluid heat fluid transfer assembly mated to a computer equipment case containing internal heat transfer conduit, and another computer equipment case with typical air flow in line with air flow heat transfer module mated to cooling fluid heat fluid transfer assembly.
Figure 15:
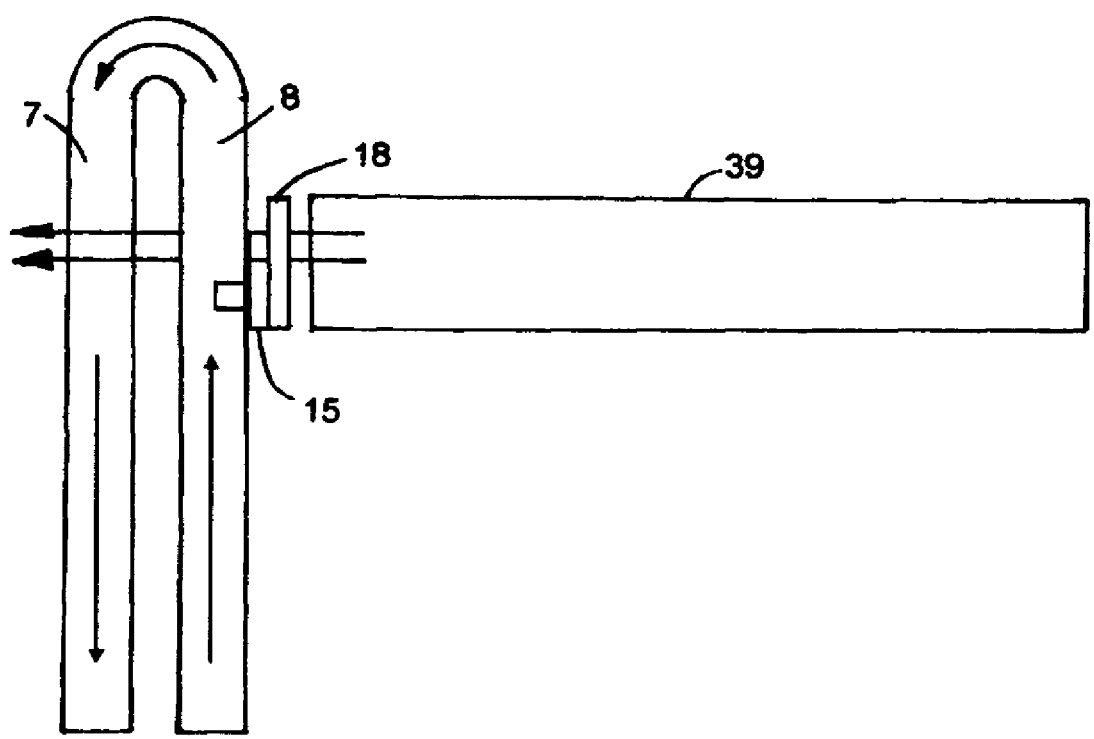
FIG. 15 illustrates a side view of airflow heat transfer module mated to cooling fluid heat fluid transfer assembly in line with typical air flow computer equipment case.

In an alternative embodiment, as shown in FIG. 13-15 said thermal transfer system is a more conventional air cooling method wherein heat is transferred through fan driven air flows out of said computer equipment case towards heat fins 50 extending from the heat transfer medium coupled or in close proximity to the back of the computer equipment case. Additionally, air cooled servers 39 may be in the same rack 1 as servers 3 equipped with solid heat transfer medium 21 as shown in FIG. 14. Said heat fins absorb heat through heat transfer from the air facilitated by the large surface areas of said fins; additionally heat is extracted through a solid heat transfer medium to deposit excess heat to a fluid pipe 8 of the cooling fluid heat transfer assembly. Additionally, a thermal transfer system includes a solid thermal transfer medium used in conjunction with more conventional air-cooling methods utilizing fans to evacuate the heat from said server.

Said solid heat transfer medium 21 may be modular based on the configuration of either the type of computer equipment case, mainboard or heat generating components. Said heat transfer medium may be formed specifically for specific computer equipment configurations or have a modular configuration wherein there is a main body for the heat transfer medium which extends into the case of the computer equipment wherein at least one extending member(s) 60 may be configured to be in thermal contact with heat generated components within said computer equipment.

In the following description, the concrete example of the configuration will be described in detail with reference to FIG. 1. More specifically, the rack-mount server system shown in FIG. 1 includes: a rack cabinet 1; a plurality of servers 3, cooling fluid heat transfer assembly composed of a inflow pipe 8, an outflow pipe 7, and flanges 13, 15 connected to a heat transfer medium 21, and the like, and the rack-mount server system shown in FIG. 1 has a configuration as follows.

In the rack cabinet 1, the circulation system of the cooling fluid heat transfer assembly 8, 7 is formed in the mounting direction of the servers 3, and the cooling liquid is circulated by means of the main circulation pump within an existing server room cooling system. Furthermore, the heat of the cooling liquid is carried to the outside or a heat exchanger which cools the circulating coolant. The cooling fluid heat transfer assembly 8, 7 may connect to piping 27, 29 from an existing chiller system or server room cooling apparatus through the raised floor or from above the rack 1.

The, cooling fluid heat transfer assembly consists of inflow pipe 8 from which the fresh cooling liquid is carried and the outflow pipe 7 which returns the warmed cooling liquid to the fluid chiller system. A plurality of servers 3 are similarly connected to the cooling fluid heat transfer assembly inflow pipe 8 via the mating of flanges 13 and 15 to the heat transfer medium 21.

The commonly used rack cabinet 1 is provided with four posts serving as mount angles at the four corners thereof to which the computer equipment is attached. The cooling fluid heat transfer assembly 7, 8, 15 is arranged vertically in the rear spacing of the rack cabinet 1. Alternatively, rack cabinet can be pre-assembled with said cooling fluid heat transfer assembly 7, 8, 15

As the cooling fluid heat transfer assembly 7, 8, 15 may be arranged in a fixed, but dismantlable manner in the vicinity of the rear of cabinet 1 and rigid or flexible connecting pipes can be used between circulation pipe 7, 8 and building-side cold water supply pipe system 27, 29 via shut off valves 28 and couplings 34.

Figure 26:
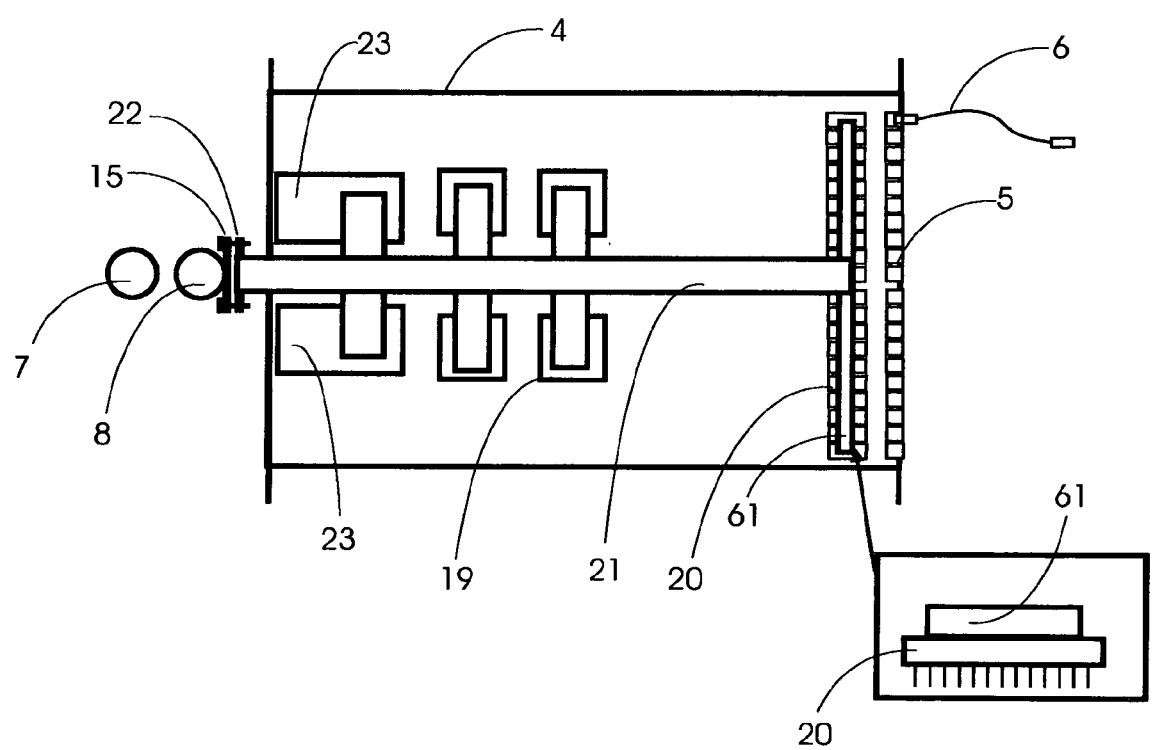
FIG. 26 illustrates a top view of computer equipment case typical of network equipment such as a router, containing internal heat transfer conduit, which is mechanically and thermally coupled to internal heat producing components such as a CPU and power supply, is mechanically and thermally mated via flanges to the cooling fluid heat fluid transfer assembly.

In another embodiment as shown in FIG. 26 a computer network equipment case 4 (such as typically used for routers and switches) containing heat transfer conduit 21 which is in direct thermal contact with heat producing components such as a CPU 19 and power supply 23 and could also extend directly to other heat producing components such as integrated circuits 20 or indirectly via heat transfer sub-assembly 61. The heat would travel via the transfer conduit 21 to the flange 22. Flange 22 mates and is affixed with bolts 17 to flange 15, which is attached and thermally connected to the cooling fluid pipe 8 of the rack mounted cooling fluid assembly consisting of 7,8, and 15. Also shown for clarity are front panel connectors 5 as typically found in network equipment and external plug-in cable 6.

As described above, the effects as follows can be achieved by the cooling system for the rack-mount server system according to the embodiments.

An efficient method of heat removal from rack mounted computer equipment, such as servers, network gear and other electronic equipment, consisting of solid heat conducting components in direct contact with the heat sources. In particular, this invention is primarily focused on the ability to efficiently and effectively cool computer equipment in standard computer rack cabinets.

This design consists of two specific areas of invention being an improvement over existing systems:

1. Part 1 of the Invention—The design of an efficient solid heat transfer structure within the computer equipment itself. This includes computer servers known as "Blade Servers"
2. Part 2 of the Invention—The design of a compact and efficient solid-to-fluid heat transfer structure mounted within the rack cabinet for the computer equipment to attach to, in order to efficiently transfer the internal server heat load to an external fluid cooling system.

This invention utilizes a design that retains the general existing form factor of the rack mounted computer equipment, but uses direct contact heat transfer to a metal (Copper, Aluminum or other metal or efficient heat conducting material) heat transfer conduit contained within the computer equipment chassis. Furthermore, it is coupled to an external solid-to-fluid heat exchanger as a method of heat transfer. This is much more efficient than air as heat transfer medium which it the common method of heat removal from existing standardized rack mounted computer equipment. This invention covers the design of the heat transfer components within the chassis of rack mounted computer equipment and the heat transfer system components external to the computer equipment within rack enclosure, as well as the external cooling system components necessary to connect to existing fluid based heat transfer system and processes.

This design would allow for the utilization of the general mechanical guidelines and dimensions of a "standard" computer rack cabinet, but would encompass heat removal components and methodologies as part of the computer equipment itself. The rack mounted cooling fluid heat transfer assembly and fluid piping components could be designed to be included into a complete rack cabinet or it could be made to be retrofitted into most existing rack cabinets. This design provides the efficient heat transfer benefits of fluid based cooling, without introducing fluids to the computer equipment itself The design is such that computer equipment could still be easily installed and removed from the rack cabinet with the same relative simplicity as conventional rack mounted air cooled computer equipment, since no pipes or hoses are connected to the computer equipment itself.

Current industry practice for heat removal from most modern computer equipment are based on internal fans forcing ambient air though the computer equipment system cabinet. This invention overcomes the thermal limitations of using air as the heat removal medium, by keeping all fluids external to the computer equipment. This design allows the continued use of existing industry standards for rack mounting of computer equipment into cabinets with more effective and efficient heat removal system without introducing any fluids into the computer equipment.

Because the improvements in the various design elements contained herein, this invention provides the following multiple benefits:

1. Far greater heat extraction capacity from the computer equipment such as servers—resulting in the ability for more, higher power, CPUs to be effectively cooled in small form factor, rack mounted computers.
2. Far greater overall computer power density due to greater heat extraction capacity
3. Far smaller cooling system components within the data center, providing more floor space for computers. Thus further increasing overall data center capacity, since more floor space for rack cabinets will become available as there would be far fewer Computer Room Air Handlers (CRAHs).
4. Greater cooling system reliability, since there are fewer, simpler components for the cooling system.
5. Far lower cooling system maintenance costs, since there are fewer, simpler components for the cooling system.
6. Far greater cooling system energy efficiency since there is direct contact heat transfer from the heat source (i.e. CPU) to a solid heat conductor, then directly transferred to fluid. This eliminates the greatest sources of inefficient heat transfer: heat source to air, then to air handler to fluid.
7. Lower cost for the cooling system since the heat exchanger has no moving parts and is simpler to manufacture compared to a conventional Computer Room Air Handler.
8. Higher overall energy efficiency since there are no fans or blowers used to move air in Computer Room Air Handlers.
9. Higher computer equipment energy efficiency, since it will no longer require as many fans (or any fans).
10. Higher computer equipment reliability and lower maintenance costs of the computer equipment itself, since it will no longer require any fans (or any fans). The primary heat producing components (CPUs, power supplies, etc.) will operate at lower temperatures than conventional air cooled computer equipment.
11. Lower overall acoustical noise within the computer room, since there would fewer fans or fans that would run at lower speeds within the computer equipment and fewer room air cooling units or units with fans that could run at lower speeds, since there is less air based heat removal required.

The invention can encompass several design variations to meet different levels of system redundancy and heat removal capacities.

1. Single Fluid Path System—The computer equipment such as a server would have the CPUs (and other heat producing components, such as the Power Supplies)

transfer the heat via direct contact with the Heat Transfer Bar on the Server. The Heat Transfer Bar would come into direct contact with the Fluid Piping System via a direct contact of mating surfaces, which would then transfer the heat to the Fluid Piping system. (FIG. 1-3)
2. Redundant Fluid Path System—This incorporates the same basic design as FIG. 1, but with separate fluid paths for redundancy or greater heat removal capacity. (FIG. 25)
3. This incorporates the same basic design as FIG. 1 for the server, but uses overhead piping for use with overhead cooling fluid piping for non-raised floor applications. It may also to be added to an existing system in a raised floor room. (FIGS. 4, 5)
4. Thermostatically Controlled Fluid Flow rate of the basic design shown in FIG. 1, via a temperature sensing device(s) and control valve(s) (electrical and/or mechanical) to automatically match the flow rate of the cooling fluid to the heat load. This will provide improved energy efficiency by optimizing the maximum heat transfer to the fluid cooling system. It also provides a more stable operating temperature for the computer equipment. (FIGS. 6, 7)
5. This Invention may also be used for "Blade Server" type Chassis to be used in conjunction with, and incorporated into Computer Server Blades. In this version the Blade Servers would use the same basic design of having the CPUs transfer the heat via direct contact to the Heat Transfer Bar on the Blade Server. When plugged into the Blade Server Chassis, the Blade Server Heat Transfer Bar would come into direct contact with the Heat Transfer Bar contained with the Chassis, which when would then transfer the heat to the Fluid Piping system. (FIG. 8-10)
6. Snap-on Version, of the connection to Solid-Fluid Piping, so that a server could be easily added to the cabinet via snap-on 66 or other type of heat transfer coupling. (FIG. 11)
7. Modular Heat Exchanger Adaptors for existing air cooled servers to allow the air cooled server's rear hot air exhaust to be cooled by the Fluid Piping as it exits the rear of cabinet. This would also allow an existing air cooled servers to operate normally, while reducing the heat load exhausted to the room. (FIG. 13)
8. Modular Heat Exchanger Adaptors also allow the mixed use of existing air cooled computer equipment and the new solid-transfer computer equipment (described in this application) to operate in the same cabinet. (FIG. 14)
9. Multi-Sections within the fluid piping system contained in the cabinet unit for higher Heat Removal Capacity.
10. Multi-Zones within the fluid piping system contained in the cabinet unit for different Heat Removal Rates/Capacities.
11. Multi-Zones in the external piping areas for different Heat Removal Rates/Capacities to different rack cabinets.
12. The overall physical design of the system provides for a "standard" for the mechanical layout and heat producing components within the rack mounted computer equipment.
13. The design "standard" for the external heat transfer components are such that they can be incorporated into a "standard" computer rack cabinet or can be retrofitted or added to most existing rack cabinets.
14. The size, shape and material of the computer equipment internal heat transfer components can vary to meet various levels of heat loads and number of CPUs, Disk Drives, Power Supplies and other heat sources in the computer equipment.
15. The size, shape and material of the rack based, solid-to-fluid heat exchange components can vary to meet various level of heat loads and redundancy levels of the computer equipment that attaches to it.
16. This design may be used in combination with existing air cooling servers, and Computer Room Air Handlers "CRAHs" within the same data center to handle higher power servers, without increasing the air based heat load on the CRAHs.
17. This design may be used for Non-Rack Mounted Fluid cooling of Standalone Computer Equipment and Electronic Equipment
18. This invention is designed so it could connect to several existing types of external fluid cooling systems (i.e. Chillers) that are in common use in data centers. Its use would result in greater energy efficiency in the operation of the external fluid cooling systems.

External cooling systems will operate more efficiently as a result of the invention. The "Entering Water Temperature" EWT of the chilled fluid supply can be substantially higher than the typical 45°-55° F. that is used to feed the traditional "Computer Room Air Handlers" CRAHs. This will result in a substantial decrease in the amount of chiller energy required to cool the fluid. It may even eliminate the use of the chiller during times (or areas) where the outside air temperature is at, or below 60° F.

Depending on the outside air temperature, it may be possible to operate the system with minimal or no compressor based cooling. In effect, it may be possible to remove heat by using 70-80° F. Entering Water Temperature, since the heat source (i.e. CPUs' Power supplies etc) would be virtually directly coupled (via the solid heat transfer conduit) to the circulating fluid. It is possible to operate without any energy being used to operate a chiller compressor if the outside air is 60° F. or below. It can operate with limited compressor operation at 80° F. or below. Only when the outside air is above 80° F. will the unit require compressor operation to lower the fluid temperature.

While some conventional fluid chiller systems have a so called "economizer" mode, it operates only if the outside air temperature is below 35° F. for no compressor mode, and only below 50° F. for partial compressor mode operations.

Current industry practice for heat removal from most modern computers are based on internal fans forcing ambient air though the computer system cabinet. This invention overcomes the thermal limitations of using air as the heat removal medium, while still keeping all fluids external to the server. This design allows the continued use of existing industry standards for rack mounting of servers into cabinets with more effective and efficient heat removal system without introducing any fluids into the servers.

The fluid carrying heat exchanger assembly (which encompasses the fluid piping and flange plate mating surfaces) could be incorporated into pre-manufactured rack cabinets or open racks. It (or they) would be positioned in the rear of the rack, normally in the center of the rack in a standardized (or customized) location, so that the rear mating flange from the computer server mated with the heat exchanger flange and the server could be rack mounted in the normal manner.

The cooling fluid heat transfer assembly could also be retrofitted to existing rack installations by means of mounting brackets to attach it to existing rack cabinets or open racks.

As indicated in FIGS. 13, 14 it is possible to also attach a Modular Air Heat Exchanger Adaptors to the flange of the fluid piping assembly so that it will provide air to fluid heat exchange, in addition to the solid to fluid heat exchange provided by direct contact with the server's mating flange. This could be in used in combination within the same rack cabinet so that existing conventional air cooled computer equipment could be mounted in the same cabinet as the flange equipped direct cooled computer equipment. This would allow an air cooled computer equipment rear hot air exhaust to be cooled by the Fluid Piping as it exits the rear of cabinet. This would also allow an existing air cooled computer equipment to operate normally, while reducing the heat load exhausted to the room For each rack cabinet or open rack at least one cooling fluid heat transfer assembly would be required, more than one may be used in each cabinet or open rack to provide redundancy and/or greater heat removal capacity.

Variations of cooling fluid heat transfer assembly could also be made for non-rack mounted computer systems so the benefit of direct solid to fluid heat extraction could be utilized with specialized computer other electronic devices.

The cooling fluid heat transfer assembly mounted into rack cabinet or open rack can be used in large data centers or small server rooms or network wiring closets. It effectively provides high capacity heat extraction with zero (or near zero) floor space usage. In addition to the improved overall cooling energy efficiency, it also allows more floor space to be used for computer equipment since less floor space would be used for conventional air cooling systems.

While the above invention has been described with reference to certain preferred embodiments, the scope of the present invention is not limited to these embodiments. One skilled in the art may find variations of these preferred embodiments which, nevertheless, fall within the spirit of the present invention, whose scope is defined by the claims set forth below.

I claim:

1. A cooling system for a computer equipment system having a computer rack receiving at least one heat generating electronic component therein, comprising:
   a. An air flow heat exchanger coupled to the back of the computer rack;
   b. Said exchanger having a base with venting slits which coincide with venting slits located on said computer casing;
   c. said base having a multiplicity of fins extending perpendicular from said base coinciding with said vents receiving heat from the air exhausted from said vents;
   d. at least one heat transfer medium,extending from the base of said exchanger; and
   e. said heat transfer medium having an opposing end attached to at least one cooling fluid heat transfer assembly to transfer heat from said exchanger.

2. A cooling system for a computer equipment system having at least one computer casing receiving at least one heat generating electronic component therein, comprising:
   a. An air flow heat exchanger removably coupled to the rack mounted cooling fluid assembly, wherein said exchanger having a base with venting slits which coincide with venting slits located on said computer casing;
   b. said base having a multiplicity of fins extending perpendicular from said base coinciding with said vents receiving heat from the air exhausted from said vents wherein at least one heat transfer medium extending from the base of said exchanger; and
   c. Said liquid in said entering piping and exiting piping being fed and exhausted through flooring of the rack cabinet into a main computer room chiller system located beneath raised flooring of said computer room.

* * * * *